US008159650B2

(12) United States Patent
Okita et al.

(10) Patent No.: US 8,159,650 B2
(45) Date of Patent: Apr. 17, 2012

(54) DEVICE MANUFACTURING METHOD, DEVICE MANUFACTURING SYSTEM, AND MEASUREMENT/INSPECTION APPARATUS

(75) Inventors: Shinichi Okita, Tokyo (JP); Koji Yasukawa, Saitama (JP)

(73) Assignee: Nikon Corporation, Tokyo (JP)

( * ) Notice: Subject to any disclaimer, the term of this patent is extended or adjusted under 35 U.S.C. 154(b) by 894 days.

(21) Appl. No.: 12/205,232

(22) Filed: Sep. 5, 2008

(65) Prior Publication Data

US 2009/0009741 A1    Jan. 8, 2009

Related U.S. Application Data

(63) Continuation of application No. PCT/JP2007/054279, filed on Mar. 6, 2007.

(30) Foreign Application Priority Data

Mar. 7, 2006 (JP) .................................. 2006-060439

(51) Int. Cl.
*G03B 27/42* (2006.01)
*G03B 27/32* (2006.01)

(52) U.S. Cl. .......................................... 355/53; 355/77
(58) Field of Classification Search .................... 355/53, 355/30, 77
See application file for complete search history.

(56) References Cited

U.S. PATENT DOCUMENTS

| | | | |
|---|---|---|---|
| 4,780,617 A | 10/1988 | Umatate et al. | |
| 5,825,403 A | 10/1998 | Iima et al. | |
| 5,969,441 A | 10/1999 | Loopstra et al. | |
| 6,208,407 B1 | 3/2001 | Loopstra | |
| 6,590,634 B1 | 7/2003 | Nishi et al. | |
| 6,778,257 B2 | 8/2004 | Bleeker et al. | |
| 6,897,963 B1 | 5/2005 | Taniguchi et al. | |
| 6,952,253 B2 | 10/2005 | Lof et al. | |
| 2001/0048761 A1 | 12/2001 | Hamamatsu et al. | |
| 2002/0027653 A1 | 3/2002 | Shibata et al. | |
| 2002/0076629 A1 | 6/2002 | Miwa et al. | |

(Continued)

FOREIGN PATENT DOCUMENTS

EP    1 420 298 A2    5/2004

(Continued)

OTHER PUBLICATIONS

Written Opinion of the International Searching Authority dated Jun. 12, 2007 in International Patent Application No. PCT/JP2007/054279 (with translation).

*Primary Examiner* — Peter B Kim
(74) *Attorney, Agent, or Firm* — Oliff & Berridge, PLC

(57) ABSTRACT

In the case where measurement/inspection of a wafer is performed in a measurement/inspection instrument before and after exposure is performed in an exposure apparatus, various kinds of conditions of the exposure apparatus and the measurement/inspection instrument are made to be matched. In particular, in accordance with a processing state of the exposure apparatus and a coater developer, a measurement result of a film, and the like, exclusion of a mark for overlay error measurement, adjustment of the measurement condition and correction of the measurement result, adjustment of the environment, correction of the measurement result according to the environment, and adjustment of pattern defect inspection are performed. Further, in calibration processing, aberration of a projection optical system of an exposure apparatus that transfers a pattern on a wafer for calibration, and the like are also taken into consideration. Accordingly, the yield of device production can be improved.

24 Claims, 7 Drawing Sheets

U.S. PATENT DOCUMENTS

| | | |
|---|---|---|
| 2002/0100013 A1 | 7/2002 | Miwa et al. |
| 2005/0037272 A1* | 2/2005 | Tanaka .......................... 430/30 |
| 2005/0128472 A1 | 6/2005 | Shibata et al. |
| 2005/0196033 A1 | 9/2005 | Hamamatsu et al. |
| 2005/0252506 A1 | 11/2005 | Sato |
| 2005/0259234 A1 | 11/2005 | Hirukawa et al. |
| 2005/0280791 A1 | 12/2005 | Nagasaka et al. |
| 2006/0231206 A1 | 10/2006 | Nagasaka et al. |

FOREIGN PATENT DOCUMENTS

| | | |
|---|---|---|
| JP | A-61-044429 | 3/1986 |
| JP | A-06-124873 | 5/1994 |
| JP | A-10-163099 | 6/1998 |
| JP | A-10-214783 | 8/1998 |
| JP | A-10-303114 | 11/1998 |
| JP | A-11-135400 | 5/1999 |
| JP | A-2000-505958 | 5/2000 |
| JP | A-2000-164504 | 6/2000 |
| JP | A-2001-250852 | 9/2001 |
| JP | A-2001-338870 | 12/2001 |
| JP | A-2002-100660 | 4/2002 |
| JP | A-2002-190443 | 7/2002 |
| WO | WO 98/24115 | 6/1998 |
| WO | WO 98/40791 | 9/1998 |
| WO | WO 99/23692 | 5/1999 |
| WO | WO 99/49504 | 9/1999 |
| WO | WO 2004/053955 | 6/2004 |
| WO | WO 2004/055803 A1 | 7/2004 |
| WO | WO 2004/057590 A1 | 7/2004 |
| WO | WO 2005/074014 A1 | 8/2005 |

* cited by examiner

Fig. 3B — EXPOSURE DOSE ERROR

Fig. 3C — SYNCHRONOUS ACCURACY ERROR

Fig. 3D — FOCUS ERROR

Fig. 3E — LENS ERROR

DEVICE MANUFACTURING METHOD, DEVICE MANUFACTURING SYSTEM, AND MEASUREMENT/INSPECTION APPARATUS

CROSS-REFERENCE TO RELATE APPLICATIONS

This application is a continuation of International Application PCT/JP2007/054279, with an international filing date of Mar. 6, 2007, the disclosure of which is hereby incorporated herein by reference in its entirety, which was not published in English.

BACKGROUND OF THE INVENTION

1. Field of the Invention

The present invention relates to device manufacturing methods, device manufacturing systems, and measurement/inspection apparatuses, and more particularly, to a device manufacturing method including a lithography process, for example, for manufacturing semiconductor devices, liquid crystal display devices, imaging devices such as CCD (charge-Coupled Device), thin film magnetic heads and the like, a device manufacturing system, and a measurement/inspection apparatus.

2. Description of the Background Art

A device such as a semiconductor device is manufactured by repeating a series of a plurality of substrate processing such as film forming/resist processing, exposure processing, post bake (PEB) processing, development processing, and etching processing to a substrate such as a wafer, in this order. In such series of substrate processing, for the purpose of improving the yield of device production, when individual substrate processing is finished, measurement/inspection processing of the substrate is performed. Measurement/inspection processing of a film on a substrate after the film forming/resist processing, defect inspection of a pattern formed on a substrate after the development processing or the etching processing, and the like are examples of the measurement/inspection processing.

In a device manufacturing plant, a plurality of measurement/inspection instruments that perform the same processing are installed in general, and it is usual that either one of the measurement/inspection instruments is selected from among the plurality of measurement/inspection instruments and performs measurement/inspection of the substrate. This is because such operation makes it possible to reduce a waiting time for performing the measurement/inspection processing as much as possible, and to improve the throughput.

However, even when a plurality of measurement/inspection instruments are of the same model, sometimes the difference occurs in their measurement/inspection results, when the same substrate is measured/inspected. Such difference in the measurement/inspection results remains as the difference among the instruments, even if gain, an offset component and inspection sensitivity, and the like of a sensor circuit that detects information of the substrate are set to the same values among the measurement/inspection instruments.

Thus, calibration processing was conventionally performed, in which prior to practical operation, a reference substrate for calibration is measured/inspected by the respective measurement/inspection instruments, and measurement/inspection states of the respective measurement/inspection instruments are calibrated so that the measurement/inspection results of the same pattern formed on the substrate coincide among the measurement/inspection instruments as much as possible (i.e. so that the difference among the instruments is reduced).

However, due to the difference between a substrate on which device patterns are actually formed and a reference substrate for calibration, or the difference of the pattern itself, or the like, even when the calibration operation as described above is performed, the difference among the instruments occurs in the measurement/inspection results of the actual substrate.

SUMMARY OF THE INVENTION

According to a first aspect of the present invention, there is provided a device manufacturing method of manufacturing a device through a series of substrate processing that includes measurement/inspection processing to a substrate, the method comprising: an acquisition process of acquiring at least one of information on the substrate and information on the series of substrate processing to the substrate; a selection process of selecting one measurement/inspection instrument that actually measures/inspects the substrate from among a plurality of measurement/inspection instruments that perform the same measurement/inspection processing, based on the information that has been acquired; and an adjustment process of adjusting at least one of a measurement/inspection condition and information on a measurement/inspection result of the measurement/inspection instrument that has been selected, based on the information that has been acquired.

With this method, an optimal measurement/inspection instrument is selected based on information on a substrate and/or information on a series of substrate processing to the substrate, and a measurement/inspection condition and/or information on a measurement/inspection result are/is adjusted based on the information, and therefore, the measurement/inspection condition and/or the measurement/inspection result can be matched to the substrate. With this operation, measurement/inspection without occurrence of the difference among the instruments can be performed, using any of the measurement/inspection instruments.

According to a second aspect of the present invention, there is provided a device manufacturing system that manufactures a device through a series of substrate processing that includes measurement/inspection processing to a substrate, the system comprising: an acquisition device that acquires at least one of information on the substrate and information on the series of substrate processing to the substrate; a plurality of measurement/inspection instruments that perform the same measurement/inspection processing; a selection device that selects one measurement/inspection instrument that actually measures/inspects the substrate from among the plurality of measurement/inspection instruments, based on the information that has been acquired; and an adjustment device that adjusts at least one of a measurement/inspection condition and information on a measurement/inspection result of the measurement/inspection instrument that has been selected, based on the information that has been acquired.

With this system, based on information on a substrate and/or information a series of substrate processing to the substrate, which have/has been acquired by the acquisition device, the selection device selects an optimal measurement/inspection instrument. Further, based on the information, the adjustment device adjusts a measurement/inspection condition and/or information on a measurement/inspection result. Accordingly, the measurement/inspection condition and/or the measurement/inspection result can be matched to the substrate. With this operation, measurement/inspection without occurrence of the difference among the instruments can be performed, using any of the measurement/inspection instruments.

According to a third aspect of the present invention, there is provided a measurement/inspection apparatus that performs measurement/inspection processing to a substrate, the apparatus comprising: an acquisition device that acquires at least one of information on the substrate and information on a series of substrate processing to the substrate; a determination device that determines whether or not the measurement/inspection apparatus is appropriate for actually measuring/inspecting the substrate, based on the information that has been acquired; and an adjustment device that adjusts at least one of a measurement/inspection condition and information on a measurement/inspection result based on the information that has been acquired, in the case where the measurement/inspection apparatus has been determined as appropriate by the determination device.

With this apparatus, based on information on a substrate and/or information on a series of substrate processing to the substrate, which have/has been acquired by the acquisition device, the determination device determines whether or not the measurement/inspection apparatus is appropriate for actually measuring/inspecting the substrate, and in the case the measurement/inspection apparatus is determined as appropriate, the adjustment device adjusts at least one of a measurement/inspection condition and information on a measurement/inspection result based on the information that has been acquired. Accordingly, the measurement/inspection condition and/or the measurement/inspection result can be matched to the substrate.

BRIEF DESCRIPTION OF THE DRAWINGS

In the accompanying drawings;

FIGS. 3A to 3E are views showing a relation between a mark for overlay error measurement and a control error of various control systems;

DESCRIPTION OF THE EMBODIMENT

An embodiment of the present invention will be described below, referring to FIGS. 1 to 6.

Figure 1:
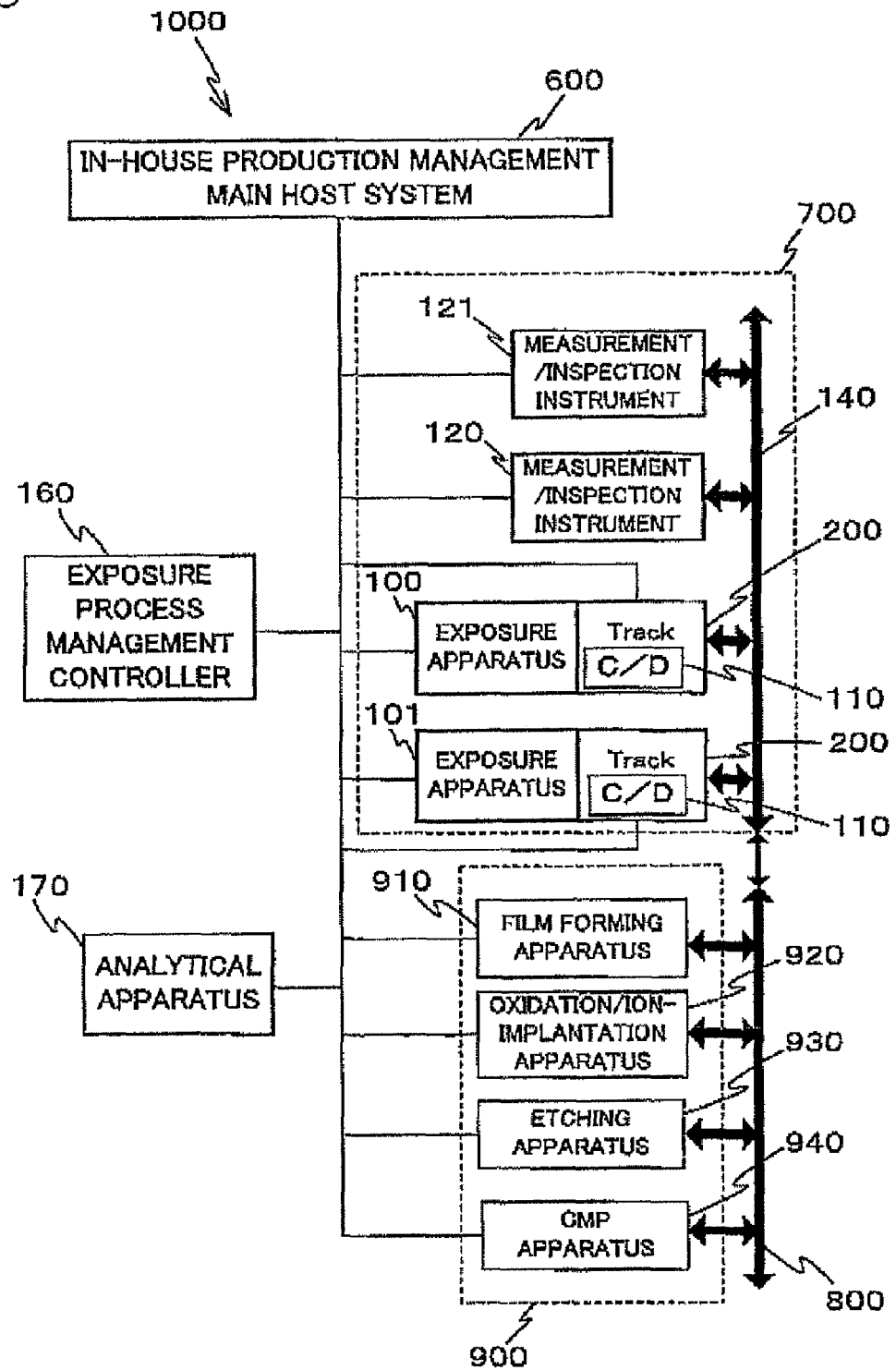
FIG. 1 is a view showing a schematic configuration of a device manufacturing system related to an embodiment.

FIG. 1 shows a schematic configuration of a device manufacturing/processing system 1000 related to the embodiment. As shown in FIG. 1, device manufacturing/processing system 1000 is equipped with an in-house production management main host system 600, an exposure cell 700, a carrier line 800, a device manufacturing/processing apparatus group 900, an exposure process management controller (hereinafter, shortly referred to as a "management controller") 160, and an analytical apparatus 170.

[In-House Production Management Main Host System]

In-house production management main host system (hereinafter, referred to as "host") 600 is a main host computer that grasps the state of the entire device manufacturing/processing system 1000, and performs overall control of exposure cell 700, carrier line 800, device manufacturing/processing apparatus group 900, management controller 160, and analytical apparatus 170.

Host 600, exposure cell 700, carrier line 800 (to be more specific, its controller), device manufacturing/processing apparatus group 900, management controller 160, and analytical apparatus 170 are connected via a wired or wireless communication network, or a dedicated communication line, and data communication can be performed among them. With this data communication, host 600 realizes the overall control of the entire device manufacturing/processing system 1000.

Exposure cell 700 is equipped with a plurality of exposure apparatuses 100 and 101, a plurality of tracks 200, a plurality of measurement/inspection instruments 120 and 121, and a carrier line 140. Although only two each of the exposure apparatuses, the tracks, and the measurement/inspection instruments are shown in FIG. 1 for the sake of simplicity of explanation, three or more of them may be provided in actual practice.

[Exposure Apparatus]

Each of exposure apparatuses 100 and 101 is an apparatus that transfers device patterns onto a wafer that is coated with a photoresist. Since exposure apparatuses 100 and 101 are of the same model, the configuration and the like will be explained, focusing on exposure apparatus 100 as a representative in the description below.

Figure 2:
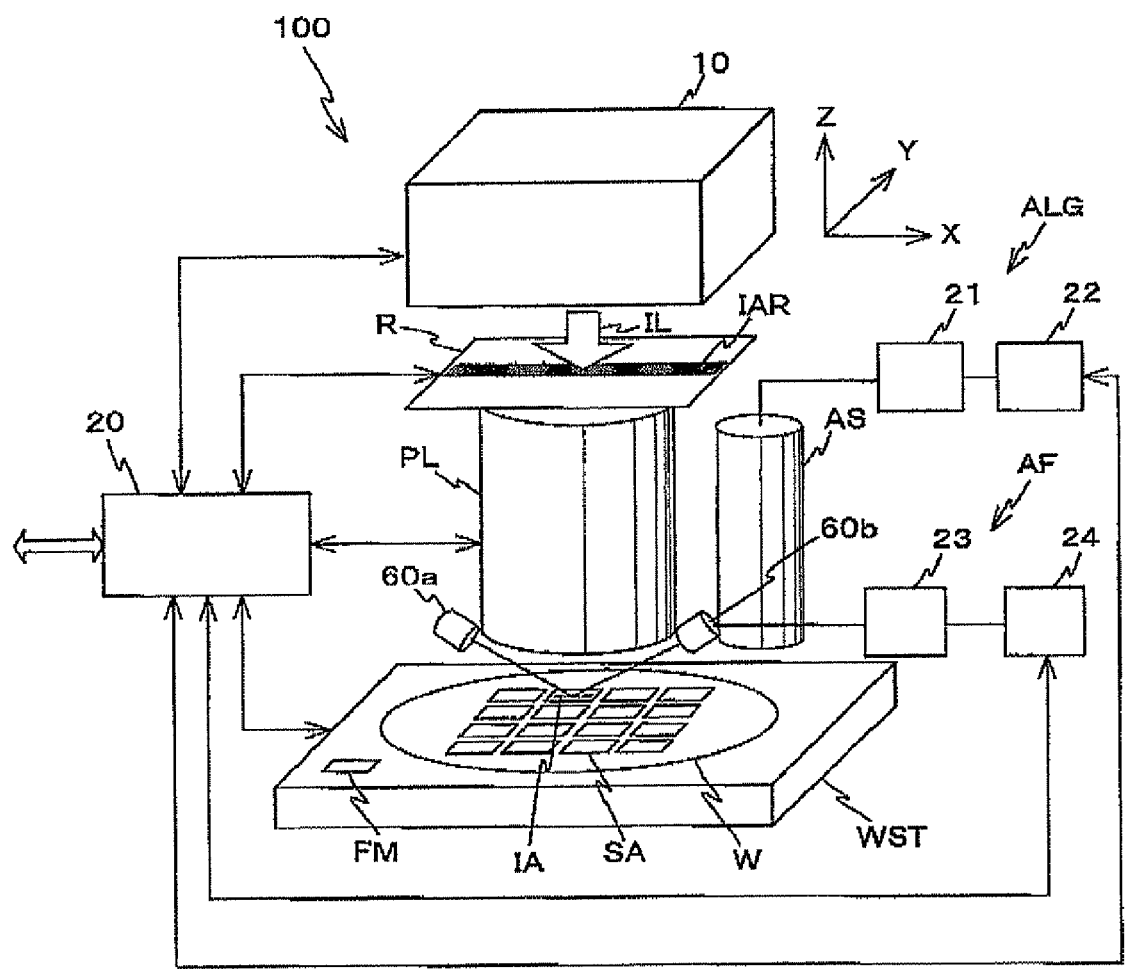
FIG. 2 is a view showing a schematic configuration of an exposure apparatus.

FIG. 2 shows a schematic configuration of exposure apparatus 100. As shown in FIG. 2, exposure apparatus 100 is equipped with an illumination system 10 that emits a coherent illumination light IL, a reticle stage (not shown) that holds a reticle R on which a device pattern and the like illuminated by illumination light IL are formed, a projection optical system PFL that projects the device pattern and the like illuminated by illumination light IL, and is, for example, both-side telecentric, a wafer stage WST that holds a wafer W subject to exposure, an off-axis alignment system ALG, a main controller 20 that performs overall control of the foregoing, and the like.

Illumination light IL from illumination system 10 illuminates a device pattern and the like formed on reticle R held by the reticle stage. Hereinafter, this illumination area will be described as an illumination area IAR. Illumination light IL via illumination area IAR is incident on wafer W held by wafer stage WST via projection optical system PL. With this operation, a projected image of the device pattern within illumination area IAR is formed on wafer W. Hereinafter, this area on wafer W is described as an exposure area IA.

An XYZ coordinate system with a coordinate axis parallel to an optical axis of projection optical system PL being a Z-axis will be considered here. Wafer stage WST can move within an XY plane, and also can shift the surface of wafer W in the X-axis and adjust the surface in a θx (rotation around an X-axis) direction, and a θy (rotation around a Y-axis) direction. The reticle stage can move in a Y-axis direction synchronously with wafer stage WST. The surface of wafer W passes across exposure area IA in synchronism with the device pattern on reticle R passing across illumination area IAR by synchronous scanning in the Y-axis direction of the reticle stage and wafer stage WST (hereinafter, referred to as both the stages, as needed) in accordance with the projection magnification of projection optical system PL. With this operation, the entire device pattern on reticle R is transferred onto wafer W. Exposure apparatus 100 repeats relative synchronous scanning of both the stages described above and inter-shot stepping of wafer stage NST within the XY plane, so that the device pattern on reticle R is transferred to a plurality of different areas (shot areas SA) on wafer W. That is, exposure apparatus 100 is an exposure apparatus by a scanning exposure (step-and-scan) method.

In main controller 20, various types of control systems are built up, such as an exposure dose control system that controls the intensity (exposure dose) of illumination light IL, stage control systems that perform synchronous control of both the stages, autofocus/leveling control (hereinafter, simply referred to as focus control) to conform the surface of wafer W within a depth of focus of projection optical system PL, and the like, and a lens control system that controls image-forming performance of projection optical system PL (none of which are shown).

The exposure dose control system performs feedback control in which based on the detection values of various exposure dose sensors that can detect the exposure dose, the exposure dose is made to coincide with a target value. Time-series data of control error in this feedback control or the like is constantly stored as log data at an interval that is designated in advance.

Based on the measurement values of an interferometer and/or another sensor that measure(s) the positions of the respective stages, the stage control systems control the positions and the speed of both the stages so that the positions are made to coincide with target positions.

Of the stage control systems, a control system that performs synchronous control of both the stages is to be a synchronous control system, and a control system that controls the Z-position (i.e. the position of a wafer in the optical axis direction of projection optical system PL (focus position)) of the stage (the wafer surface), and a rotational amount around the X-axis and the Y-axis (inclination of the wafer surface with respect to a projected image of a device pattern) is to be a focus control system.

During scanning exposure, the synchronous control system performs synchronous control of both the stages and based on the measurement values of the interferometer and the like, performs feedback control so that synchronous error of the stages is reduced. Further, in exposure apparatuses 100 and 101, a focus detection system AF by an oblique incident method that detects focus/leveling deviation of the wafer surface at a plurality of measurement points (although only one point is shown in FIG. 2, there are a plurality of measurement points in actual practice). Focus detection system AF is equipped with a focus optical system (60a, 60b) a focus sensor 23, and a focus signal processing device 24.

The focus optical system (60a, 60b) is placed so that a plurality of lights (e.g. 7×7=49) that are emitted from a light-transmitting system 60a and are obliquely incident on the surface to be exposed of wafer W and reflected off the surface are received by a photodetection system 60b. Each light is a light that includes information on a surface height at a plurality of measurement points on the surface to be exposed of wafer W. Focus sensor 23 photoelectrically converts the plurality of lights received by photodetection system 60b, and selects, for example, around 9 measurement points from among the plurality of measurement points, and output them to focus signal processing device 24. Based on photoelectrically converted signals corresponding to the selected measurement points, focus signal processing device 24 obtains the wafer surface height and inclination of an area including the 9 measurement points, and outputs them to main controller 20. The focus control system of main controller 20 performs feedback control so as to conform the wafer surface corresponding to exposure area IA to the image plane of projection optical system PL based on the wafer surface height and inclination. Focus sensor 23 is configured of hardware such as an electric circuit and the like. Further, focus signal processing device 24 is a computer and its function is realized by software that operates in the computer.

In order to perform focus control using focus detection system AF, apparatus parameters that define the operation of focus detection system AF are need to be appropriately set. Such apparatus parameters are called focus-related parameters. As the focus-related parameters, for example, there are a focus level difference map that is a surface shape of the surface to be exposed of wafer W, a focus offset that is an offset component of signal output, placement of the focus sensor, selection of the focus sensor, a focus measurement algorithm used to process focus signals, and the like.

Incidentally, time-series data of the control error of the synchronous control system and the control error of the focus control system are also stored constantly as log data at an interval designated in advance.

Projection optical system PL includes a plurality of optical elements (not shown) such as dioptric elements (lens elements). Of these lens elements, several lens elements are movable lenses whose positions and attitudes can be adjusted by the lens control system from outside. Each of these lens elements is configured drivable so as to shift in the X-axis, Y-axis and Z-axis (optical axis) directions, and drivable so as to rotate in the rotational directions ($\theta$x, $\theta$y and $\theta$z) around the respective axes, that is, is configured drivable in directions of six degrees of freedom. The lens control system monitors the atmospheric pressure, the temperature in a chamber where exposure apparatuses 100 and 101 are placed, the exposure dose, the temperature of the lenses in projection optical system, and the like, and based on the monitoring results, computes a magnification variation amount, the focus variation amount, and the like of projection optical system PL, and then based on the computation results, performs adjustment of the pressure inside projection optical system PL, adjustment of position/attitude of the movable lens elements (and adjustment of distance between the lenses), change of the focus offset and the like. Accordingly, the best focus position and the magnification come to follow the target values. The magnification variation amount and the focus variation amount are constantly stored as log data at an interval designated in advance.

Wafer W carried into exposure apparatus 100 is loaded on wafer stage WST in a state of being roughly aligned using its outer shape as a reference. In the case where shot areas SA have been already formed in an array shape on wafer W as shown in FIG. 2, the device pattern on reticle R needs to be accurately overlaid with shot area SA and transferred to the shot area.

Therefore, in exposure apparatus 100, alignment marks that are formed with the device pattern on wafer W loaded on wafer stage WST are measured by an alignment system ALG by an off-axis method, and the position coordinates of the marks in the XY coordinate system are measured.

Alignment system ALG is equipped with an alignment optical system AS that is composed of a light-transmitting system that irradiates an illumination light (a detection beam) having a wavelength band range that does not expose the resist on wafer W and a photodetection system that receives a reflected light from the surface to be exposed of wafer W. Furthermore, alignment system ALG is equipped with an alignment sensor 21 that is used to detect, for example, a signal corresponding to a mark waveform by photoelectrically detecting a light obtained via alignment optical system AS. In the case where a waveform of a detection signal obtained as a result of this photoelectrical detection is a waveform corresponding to the base of wafer W including the mark, that is, in the case where the mark exists within a detection field of alignment system ALG, the position coordinate of the mark can be detected based on the detection signal. FIG. 2 shows an alignment device 22 that processes the mark waveform detected by alignment sensor 21 and computes the position coordinate of the mark. Alignment sensor 21 is configured of a CCD and hardware such as an electrical circuit and the like. Further, alignment device 22 is a computer and its function is realized by software that operates in the computer.

Incidentally, in order to perform accurate overlay exposure of device patterns, positional information of all shot areas SA on wafer W may be measured, but such a method could affect the throughput. Thus, in exposure apparatus 100, a global alignment technology is employed, in which the alignment marks to be actually measured are limited and from the measurement result of the measured positions of the alignment marks, the arrangement of shot areas SA on the wafer is statistically estimated. In exposure apparatus 100, water alignment by a so-called EGA method is employed as the global alignment, in which the deviation of actual shot arrangement with respect to the designed shot arrangement is expressed in the polynomial with X and Y as independent variables and the proper coefficients in the polynomial are obtained by performing a statistical computation. In the wafer alignment by the EGA method, first of all, several shot areas subject to measurement whose alignment marks are measured are selected. The selected shot areas are called sample shots. Alignment system ALG measures the positions of the alignment marks arranged at the samples shots (samples marks). Hereinafter, such a measurement operation will be referred to as an EGA measurement.

In the wafer alignment by the EGA method, a correction amount that denotes the arrangement of shot areas SA is estimated from the result of the EGA measurement, that is, the statistical computation based on positional information of several sample marks. Hereinafter, such a computation will be referred to as an EGA computation. Incidentally, the wafer alignment by the EGA method is disclosed in, for example, Kokai (Japanese Unexamined Patent Application Publication) No. 61-044429 and the corresponding U.S. Pat. No. 4,780,617 and the like. Incidentally, the coordinate system of the arrangement of shot areas SA uses a fiducial mark formed on a fiducial mark plate FM as a reference.

An XY correction amount of the position of each shot area that is obtained by the above-described polynomial is called an EGA correction amount The coefficients of the polynomial obtained by the wafer alignment by the FGA method are obtained by the least-squares method, and therefore a deviation (a nonlinear error component) remains between the actual measurement value of the mark position and the mark position corrected by the EGA correction amount. Such a deviation is called a residual error. It is a matter of course that the residual error is preferably small from the viewpoint of accuracy.

One of means for reducing the residual error is to make an EGA polynomial model be a high-order expression. For example, the residual error can naturally be reduced by making the EGA polynomial model not be a primary expression, but be a quadratic expression or a cubic expression. In the case of making the EGA polynomial model be a high-order expression, however, the number of sample marks needs to be increased accordingly.

Further, in the case where measurement results of some of sample marks are remarkably deviated from the actual shot arrangement, the entire residual error tends to be larger. Accordingly, it is desirable to reject the measured positions of such sample marks so that they are not used in the EGA computation. That is, it is also possible to increase the estimation accuracy by not using some of positional information of the sample marks, which have been measured by the EGA measurement, in the EGA computation. As is described above, the selection of the number and/or the placement of sample marks are/is (an) important factor(s) for the wafer alignment by the EGA method.

[Alignment-related Parameter]

In exposure apparatuses 100 and 101, several factors that set operations related to the water alignment by the EGA method using the alignment system described above are parameterized, and their setting values can be adjusted as alignment-related parameters As is described previously, alignment system ALG is equipped with alignment optical system AS, alignment sensor 21 and alignment device 22, and the apparatus parameters that define the respective processing operations can be set.

As these apparatus parameters, in general, there are two types, that is, fixed parameters whose settings should be fixed in the setting of hardware and adjustment parameters that are preferably changed with respect to each wafer W in the setting.

As the fixed parameters, there are an aberration amount which alignment optical system AS has, a gain of alignment sensor 21, an offset component of dark current, and the like.

Meanwhile, as the adjustment parameters, there are a wavelength of an illumination light in the light-transmitting system of alignment optical system AS, a focus offset, a mark length of a mark to be measured, a mark type, a mark pitch, a mark width, a mark center shift, a signal waveform shape (single/double), a mark detection algorithm (a signal processing algorithm (an edge extraction method, a template matching method, a loopback autocorrelation method or the like, a slice level or the like)), a mark detection permissible value; and the number of sample marks necessary for the EGA measurement, the number of sample shots necessary for the EGA measurement and the EGA limit value that is a threshold value of a mark position coordinate to be rejected as is described above; and the like. In view of interference due to film thickness of a resist film or the like, a reflectivity of the base of wafer W, and the like, the wavelength of the illuminati light should be carefully set.

Further, in the case where the alignment system is equipped with plural types of alignment sensors and performs mark detection using all the sensors, the types of the alignment sensors (an FIA (Field Image Alignment) method, an LSA (Laser Step Alignment) method, or the like) that detect the waveform data used in actual detection of the mark positions are also included in the alignment-related parameters.

Further, the alignment-related parameters also include types of the EGA polynomial model (a 6-parameter model, a 10-parameter model, an intra-shot averaged model, a shot factor indirectly-applied model, a high-order EGA processing condition (a use order and a use correction coefficient), and the like), a weighting EGA processing condition, an extension EGA processing condition of an EGA optional function (an intra-shot multipoint EGA implementation condition, an EGA computation model, a shot component correction condition, and the like), a correction amount (such as alignment correction value) that should be added to the measurement position of the measured mark, and the like. These parameters used to express the shot arrangement such as the EGA polynomial model and the like can also be divided into linear correction parameters that correct a liner component of the shot arrangement, and nonlinear correction parameters used to correct a nonlinear component of the shot arrangement (wafer grid). The nonlinear component of the shot arrangement is often expressed as a high-order function or a map of the XY coordinate system, and therefore, the nonlinear correction parameter serves as a coefficient of the high-order function or a correction amount on the map.

As is described above, main controller 20 is a computer system that controls the various constituents of exposure apparatus 100. The various operations of exposure apparatus 100 described above are realized by the overall control of main controller 20. The forgoing exposure dose control system, synchronous control system, focus control system, lens control system and the like are included within main controller 20. Further, main controller 20 is connected to a communication network constructed within device manufacturing/processing system 1000, and data transmission/reception can be performed with the outside via the communication network. Main controller 20 receives a command via the communication network and operates. Further, main controller 20 transmits trace data of the various control errors to analytical apparatus 170, and also receives information on the parameter optimized by analytical apparatus 170 and set it within main controller 20.

[Track]

Referring back to FIG. 1, track 200 is placed so as to contact with a chamber (not shown) that encloses exposure apparatus 100. Track 200 mainly performs carry-in and carry-out of wafer W to/from exposure apparatus 100 by a carrier line equipped inside.

[Coater/Developer]

Within track 200, a coater/developer (COD) 110 is arranged that is equipped with a coater that performs resist coating processing, a developer that performs development processing, a PEB device that performs PEB processing, and the like. C/D 110 observes the processing state of resist coating, development, and PEB processing, and can record the observation data as log data. As the processing state that can be observed, there are the state of, for example, a rotational speed of a spin coater, the temperature during development, development module processing, the temperature uniformity of PES (hotplate temperature uniformity), wafer heating history management (avoiding over-bake after the PEB processing, cooling plate). C/D 110 also can adjust the processing state to some extent by setting the apparatus (C/D) parameters. As such apparatus (C/D) parameters, for example, a parameter that can correct the thickness of resist on wafer W (dripping quantity or dripping interval of the resist), the set temperature within the apparatus (C/D), the rotational speed of the spin coater, and the like can be given.

C/D 110 can operate independently from the external apparatuses such as exposure apparatuses 100 and 101, and measurement/inspection instrument 120. C/D 110 are placed along the carrier line within track 200, and this carrier line allows wafer W to be carried among exposure apparatuses 100 and 101, C/D 110, and the outside of track 200. Further, C/D 110 is connected to the communication network within device manufacturing/processing system 1000, and data transmission/reception with the outside can be performed.

That is, exposure apparatus 100 and C/D 110 within track 200 adjacent to exposure apparatus 100, and exposure apparatus 101 and C/D 110 within track 200 adjacent to exposure apparatus 101 are inline connected to each other, respectively. The inline connection in this case means the connection between the apparatuses and between processing units within each apparatus via a carrier device that automatically carries wafer W such as a robot arm and/or a slider. With the inline connection, the time for delivery of wafer W between exposure apparatus 100 and C/D 110, and exposure apparatus 101 and C/D 110 can be remarkably shortened.

Exposure apparatus 100 and track 200, and exposure apparatus 101 and track 200, which are inline connected respectively, can also be regarded as one substrate processing apparatus (100, 200), (101, 200) as a unit. The substrate processing apparatus (100, 200), (101, 200) performs a coating process of coating a photosensitive agent such as a photoresist to wafer W, an exposure process of exposing wafer W by projecting an image of a pattern of a mask or reticle R on wafer W which is coated with the photosensitive agent, a PEB process after the exposure process ends, a development process of developing wafer W after the PEB process, and the like. Exposure cell 700 can be regarded to be equipped with one each of the substrate processing apparatus (100, 200) and the substrate processing apparatus (101, 200).

[Measurement/Inspection Instrument]

Measurement/inspection instruments 120 and 121 are combined measurement/inspection instruments that can perform various kinds of measurement/inspection for wafer W. Since measurement/inspection instruments 120 and 121 are of the same model, their configuration and the like will be explained, representatively focusing on measurement/inspection instrument 120. Measurement/inspection instrument 120 is equipped with a stage that holds wafer W, similarly to wafer stage WST in exposure apparatus 100. The XY position of this stage is measured by an interferometer (not shown) similarly to wafer stage WST. A controller of measurement/inspection instrument 120 controls the XY position of the stage based on the measurement position of the interferometer. For measurement/inspection of wafer W, first of all, alignment of wafer W is needed. Measurement/inspection instrument 120 can perform alignment of wafer W similarly to exposure apparatuses 100 and 101, and is equipped with an alignment system that is similar to alignment system ALG of exposure apparatus 100. The alignment of wafer W in measurement/inspection instrument 120 can be performed likewise, under alignment-related parameters that are similar to those of exposure apparatuses 100 and 101.

Besides the forgoing, measurement/inspection instrument 120 is equipped with sensors described below, to perform various kinds of measurement/inspection to wafer W.

(1) An interferometer used to measure the film thickness of films such as an antireflection film, a photoresist film, a topcoat film and the like on wafer W.

(2) An alignment system arranged to perform measurement of alignment marks on wafer W, which is similar to alignment system ALG.

(3) A measurement device that performs measurement of a surface shape (so-called shot flatness (device topography, focus level difference) of wafer W, and is similar to focus detection system AF.

(4) A sensor used to perform inspection of a foreign material and/or stain on wafer W, which is a sensor by an alignment sensor or a laser scan method.

(5) An imaging device used to perform measurement of linewidth and/or overlay error of patterns formed on wafer w, which can image the device patterns.

(6) A sensor used to perform inspection of pattern defect on water W, which is an imaging device of high power or a sensor by a laser scan method.

Besides the above-described sensors, measurement/inspection instrument 120 is equipped with various sensors in accordance with necessary measurement/inspection contents.

Measurement/inspection instrument 120 can operate independently from exposure apparatuses 100 and 101 and C/D 110. Carrier line 140 within exposure cell 700 is to be capable of Carrying each wafer W among exposure apparatuses 100 and 101, C/D 110, and measurement/inspection instruments 120 and 121. Further, measurement/inspection instrument 120 can input/output data via the communication network.

[Device Manufacturing/Processing Apparatus Group]

As device manufacturing/processing apparatus group 900, a film forming apparatus 910, an oxidation/ion-implantation apparatus 920, an etching apparatus 930, and a CMP (Chemical Mechanical Polishing) apparatus 940 are arranged Film forming apparatus 910 is an apparatus that forms a thin film such as an antireflection film, a topcoat film or the like using CVD (Chemical Vapor Deposition) or the like. Oxidation/ion-implantation apparatus 920 is an apparatus for forming an oxide film on the surface of wafer W or implanting impurities in a predetermined position on wafer W Etching apparatus 930 is an apparatus that performs etching to wafer W that has been developed. CMP apparatus 940 is a polisher that planarizes the surface of wafer W by chemical mechanical polishing. All of these apparatuses can adjust the processing states by adjustment of their processing parameters, and also can observe the processing states and perform logging of data on the processing states as log data. Further, the respective apparatuses can input/output data via the communication network.

Among film forming apparatus 910, oxidation/ion-implantation apparatus 920, etching apparatus 930 and CMP apparatus 940, a carrier route that makes it possible to carry wafer W among them is arranged. Besides the above-described apparatuses, device manufacturing/processing apparatus group 900 includes apparatuses that perform probing processing, repair processing, dicing processing, packaging processing, bonding processing and the like.

[Carrier Line]

Carrier line 800 performs carriage of wafer W between various apparatuses in device manufacturing/processing apparatus group 900 and exposure cell 700. By a collaborated operation of carrier line 800 and carrier line 140 within exposure cell 700, wafer W is carried from an apparatus that completes processing to wafer W to an apparatus that performs next processing to wafer W.

[Management Controller]

Management controller 160 performs intensive management of an exposure process that is implemented by exposure apparatuses 100 and 101, and also performs management of C/Ds 110 within tracks 200 and measurement/inspection instruments 120 and 121 and control of their cooperative operations. As such a controller, for example, a personal computer (hereinafter, shortly referred to as PC, as needed) can be employed. Management controller 160 receives information showing the status of progress of processing and operations, and information showing processing results and measurement/inspection results through the communication network within device manufacturing/processing system 1000 and grasps the status of the entire manufacturing line of device manufacturing/processing system 1000, and performs management and control of the respective apparatuses so that the exposure process and the like are appropriately performed.

[Analytical Apparatus]

Analytical apparatus 170 is connected to the communication network within device manufacturing/processing system 1000, and can perform data transmission/reception to/from the outside. Analytical apparatus 170 acquires information on wafer W and information on processes to wafer W, and analyzes the acquired information. To be more specific, analytical apparatus 170 analyzes measurement/inspection results of measurement/inspection instruments 120 and 121, and if necessary, optimizes the apparatus parameters of exposure apparatuses 100 and 101 and the like based on the analytical results. Further, analytical apparatus 170 performs selection of a measurement/inspection instrument that is suitable for performing measurement/inspection to wafer W and adjustment of measurement/inspection conditions of the measurement/inspection instrument and the like.

As hardware that realizes such analytical apparatus 170, for example, a personal computer can be employed. In this case, the analytical processing is realized by executing an analytical program by a CPU (not shown) of analytical apparatus 170. The analytical program is supplied from a medium (information recording medium) such as CD-ROM, and executed in a state of being installed in the PC.

Further, analytical apparatus 170 is equipped with a database necessary for analysis. As one of the database, there is a CD table group. The CD table group is a database in which a relation among illumination conditions of exposure apparatuses 100 and 101, each control error of exposure dose, synchronous accuracy, focus and lens, and pattern linewidth is registered.

When overlay error of device patterns that have been formed by transfer on wafer W is measured, this CD table group is used to select marks for overlay error measurement that have been transferred together with the device patterns.

Figure 3A:
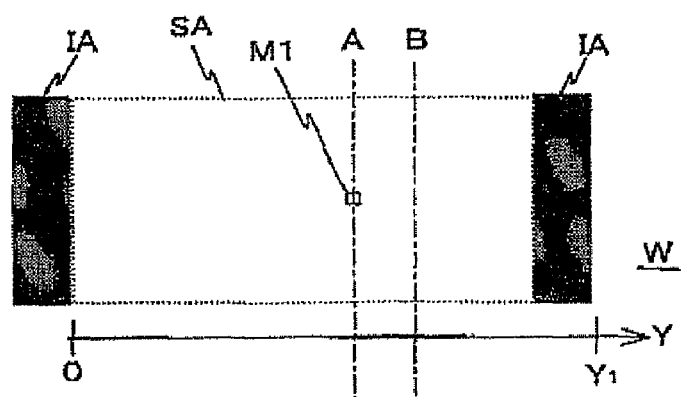

FIG. 3A typically shows a relation between a mark for overlay error measurement that is transferred together with a device pattern within shot area SA, and control error of various control systems of exposure dose, synchronous accuracy, focus, lens and the like. It is assumed that a device pattern is transferred on shot area SA on wafer W shown in FIG. 3A by exposure area IA moving relatively with respect to wafer W, from a position of $Y=0$ to a position of $Y=Y_1$ at a constant scan speed. Further, this device pattern is assumed to include a mark M1 for overlay error measurement.

FIGS. 3B to 3E show an example of log data on exposure dose control error, synchronous accuracy control error, focus control error and lens control error, respectively. As shown in FIGS. 3B to 3E, out of these log data, log data that contributes to transfer of mark M1 for overlay error measurement is log data from $Y=A$ to $Y=B$ Accordingly, analytical apparatus 170 judges whether or not mark M1 for overlay error measurement is appropriate for actually measuring overlay error, based on the statistical value (e.g. a moving average value (MEAN value), a moving standard deviation (MSD value), or the like) of the log data from $Y=A$ to $Y=B$ of exposure dose error, synchronous accuracy error, focus error and lens error.

In the CD table group, a relation among the illumination conditions in exposure apparatuses 100 and 101; the statistical value of exposure dose control error, synchronous accuracy control error, focus control error and lens control error; and pattern linewidth at each position, during relative synchronous scanning of wafer stage WST and the reticle stage, is accumulated. Analytical apparatus 170 refers to this CD table group, in order to estimate the pattern linewidth of each mark for overlay error measurement transferred onto wafer W and judge whether or not the mark is appropriate for measurement, based on various kinds of control error log data acquired from exposure apparatuses 100 and 101. Incidentally, in the case where the statistical value of exposure dose control error, synchronous accuracy control error or focus control error is a value that is not registered in the database, the pattern linewidth is estimated by an interpolation computation of several values near the statistical value.

In order to estimate the pattern linewidth effectively based on the CD table group, a relation between the statistical values of various control errors and the pattern linewidth needs to be registered in advance. On this registration, the statistical values of control error of various control systems computed from the trace data during exposure to wafer W in exposure apparatuses 100 and 101 and the pattern linewidth measured by measurement/inspection instrument 120, actually, may be registered. Incidentally, the pattern linewidth registered in the CD table group can be not based on the measurement result of measurement/inspection instrument 120, but based on a value measured by SEM or a value measured by an OCD method or the like, or can be a value obtained by an aerial image of a test pattern measured by an aerial image sensor that measures an aerial image of a test pattern.

Incidentally, even when exposure dose error, synchronous accuracy error, focus error and lens error are completely the same, the pattern linewidth differs depending on exposure conditions of exposure apparatuses 100 and 101, design conditions of patterns to be transferred, image height or the like. Therefore, this table group is prepared for the respective combinations of exposure conditions, pattern design conditions, and image heights. In this manner, a database of the table group needs to be complied so that an estimated value of pattern linewidth can be searched, using an exposure condition, a pattern design condition, exposure dose control error, synchronous accuracy control error, focus control error, or lens control error as a key for the search. Incidentally, as the exposure conditions, an exposure wavelength, a projection optical system NA, an illumination NA, an illumination σ, an illumination type, a depth of focus, and the like can be given, and as the pattern design conditions, a mask linewidth, a target linewidth (e.g. 130 nm), a pattern pitch, a mask type (binary, halftone, Levenson), a pattern type (an isolated line, a dense line (a line-and-space pattern)), and the like can be given. The relation among the exposure conditions, the pattern design conditions and the pattern linewidth, and the setting method of various conditions such as the image height and the like in the table are disclosed in detail in, for example, Kokai (Japanese Unexamined Patent Application Publication) No. 2001-338870.

Besides the above-described databases, analytical apparatus 170 is equipped with a database accumulating analytical results.

[Calibration Processing]

As shown in FIG. 1, device manufacturing/processing system 1000 related to the embodiment has a plurality of measurement/inspection instruments 120 and 121 that perform the same measurement/inspection processing and a plurality of exposure apparatuses 100 and 101. Accordingly, for example, when executing the same process, if one of the measurement/inspection instruments or the exposure apparatuses is in a busy state, the other of the measurement/inspection instruments or the exposure apparatuses is used, thereby shortening the wafer waiting time to improve the throughput.

However, when the measurement/inspection instruments are different, the difference occurs in their measurement/inspection results in some cases, even if completely the same wafer is loaded. This is because even when the measurement/inspection instruments are of the same model, the properties are different between the respective instruments. Therefore, in order to reduce the difference between a plurality of measurement/inspection instruments 120 and 121 that perform the same kind of measurement/inspection according to the scheduling as described above, calibration processing of the measurement/Inspection instruments is performed prior to the actual operation.

In the calibration processing, a wafer for calibration is used. This wafer for calibration is a wafer on which many patterns for calibration that can be measured by the alignment systems of the respective apparatuses/instruments 100, 101, 120 and 121 are formed. The measurement/inspection patterns for calibration are formed across substantially the entire surface on the wafer for calibration.

First of all, the wafer for calibration on which the patterns for calibrations are formed is sequentially loaded to exposure apparatuses 100 and 101 and measurement/inspection instruments 120 and 121 and each of the alignment systems detects (measures) the same pattern on the wafer for calibration, and the optical system (alignment optical system AS in the case of exposure apparatus 100 in FIG. 2) and the alignment sensor (alignment sensor 21 in the case of exposure apparatus 100 in FIG. 2) of each alignment system are adjusted so that mark waveform signals acquired by the alignment systems of the respective apparatuses/instruments 100, 101, 120 and 121 become identical. On the wafer for calibration, a plurality of different types of patterns (e.g. a plurality of representative patterns whose linewidths and/or shapes are different respectively) are formed, and matching adjustment is performed here so as to match the mark waveforms detected in all of these patterns, among the apparatuses/instruments.

Next, matching adjustment of focus detection Systems AF of the respective apparatuses/instruments 100, 101, 120 and 121 is performed. First of all, the best image-forming planes of projection optical systems PL of exposure apparatuses 100 and 10 and the best image-forming planes of the optical systems of measurement/inspection instruments 120 and 121 are obtained by a method such as an aerial image measurement. Then, fiducial mark plate FM arranged on the stage that holds wafer W is located at the best image-forming plane. A defocus amount of fiducial mark plate FM is detected at a plurality of measurement points of focus detection system AF, using focus detection system AB. The detection result in this operation serves as an offset component of each measurement point. Further, the stage is moved in the optical axis direction of projection optical system PL and adjustment of the focus optical system (60a, 60b) offset and gain adjustment of focus sensor 23, and the like are performed so that the defocus amounts at a plurality of measurement points obtained by moving the stage become the same.

The foregoing two matching adjustments allow alignment systems ALG and focus detection systems AF of exposure apparatuses 100 and 101 and measurement/inspection instruments 120 and 121 to perform measurement in substantially the same state with respect to the same mark of the same wafer.

Incidentally, after that, the wafer for calibration on which the patterns for calibration are formed is sequentially loaded again in exposure apparatuses 100 and 101 and measurement/inspection instruments 120 and 121, and a nonlinear component of stage movement (a nonlinear component of stage grid), which shows the deviation between the XY coordinate system that holds water W of the respective apparatuses/instruments 100, 101, 120 and 121, and a coordinate system in the case of moving the stage that holds wafer W according to the measurement values of the interferometer, may be obtained. Here, the pattern formed on the water for calibration is moved so as to be located within a detection field of the alignment system, and the position of the pattern is measured by the alignment system. The measurement value of positional deviation of the pattern on this measurement corresponds to the nonlinear component of stage grid. This measurement value is set in the respective apparatuses/instruments 100, 101, 120 and 121, as the apparatus/instrument parameter. With this operation, the difference of stage grid among the respective apparatuses becomes substantially zero. Accordingly, in the case where, in order to severally measure the same mark on the same wafer W, when the stage holding the wafer W is moved so as to locate the mark within the detection field of the alignment system, if the wafer W is held on the stage in completely the same state, then the position of the mark is set at substantially the same position within the detection field of the alignment system in any of the apparatuses/instruments.

[Device Manufacturing Process]

Figure 4:
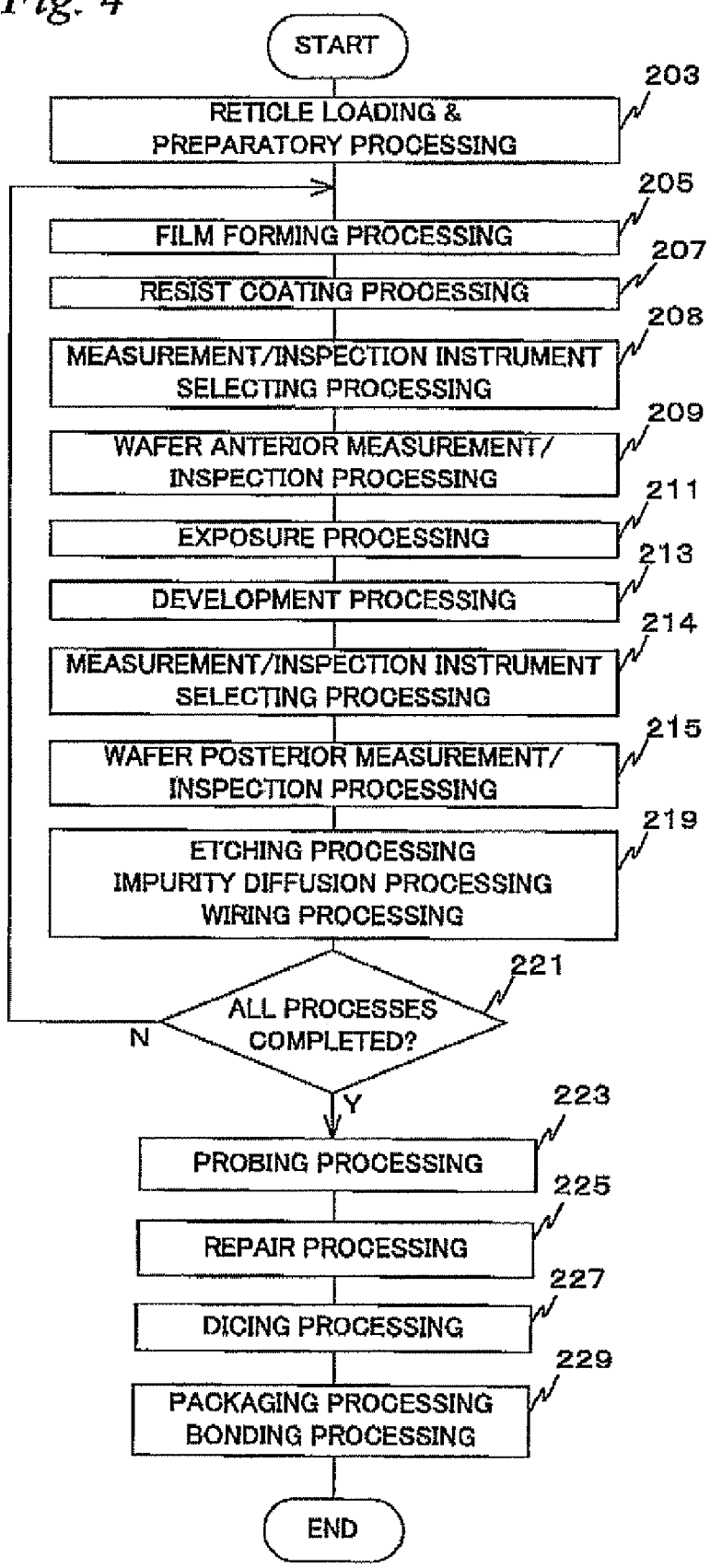
FIG. 4 is a flowchart of a wafer process.

A flow of a series of processes in device manufacturing/processing system 1000 will be explained next. FIG. 4 shows a flowchart of these processes. This series of processes of device manufacturing/processing system 1000 are scheduled and managed by host 600 and management controller 160. In actuality, the processing shown in FIG. 4 is repeated for every wafer, for example, in a pipeline manner.

As shown in FIG. 4, first of all, in step 203, reticle R is loaded on the reticle stage, and preparatory operations such as positioning of reticle R (reticle alignment), measurement of baseline (a distance (positional relation) between the detection center of off-axis alignment system ALG and the projection center of a pattern on reticle R) are performed. With such preparatory operations, overlay exposure can be performed, in which device patterns on reticle R are overlaid with and transferred to shot area SA that have been already formed on wafer W aligned on wafer stage WST.

After that, the processing to wafer W is performed in parallel with step 203 described above. First of all, a film is formed on wafer W in film forming apparatus 910 (step 205), the wafer W is carried to C/D 110, and a resist is coated on the wafer W in C/D 110 (step 207).

In the next step, step 208, selection of the measurement/inspection instrument (120 or 121) used to perform measurement/inspection of wafer W and setting of its measurement/inspection conditions are performed A flow of this processing is as follows.

(1) Analytical apparatus 170 inquires about which of exposure apparatus 100 and 101 should perform exposure to host 600 (or management controller 160).

(2) Host 600 (or management controller 160) sends the exposure apparatus name to analytical apparatus 170.

(3) Analytical apparatus 170 inquires about data related to processing conditions of the exposure apparatus to the selected exposure apparatus. This data includes data on processing conditions of alignment system ALG, focus detection system AF and the like.

(4) The exposure apparatus that has received the inquiry sends data on measurement/inspection conditions to analytical apparatus 170.

(5) Analytical apparatus 170 selects an optimal measurement/inspection instrument based on the received data.

In this case, analytical apparatus 170 can select a measurement/inspection instrument that performs anterior measurement/inspection processing according to compatibility with an exposure apparatus that performs exposure to wafer W. For example, as will be described later, in the case where exposure apparatus 100 is selected as an exposure apparatus that performs exposure to water W, if measurement conditions of the alignment system in a measurement/inspection instrument are matched to measurement conditions of alignment system ALG in exposure apparatus 100, and the measurement conditions of the alignment system in the measurement/inspection instrument exceeds the range where the measurement conditions can be set, then such a measurement/inspection instrument is not selected but another measurement/inspection instrument may be selected.

(6) Analytical apparatus 170 returns the selection result to host 600 (or management controller 160).

(7) Analytical apparatus 170 sends data on measurement/inspection conditions to the selected measurement/inspection instrument. Such measurement/inspection conditions include, for example: a wavelength and a focus offset at the time of mark measurement by the alignment optical system; processing conditions of a signal processing device that processes mark waveform data detected by the alignment sensor; alignment-related parameters such as, a mark length, a mark type, a mark pitch, a mark width, a mark center shift, a signal waveform shape (single/double), a mark detection algorithm, a mark detection permissible value, the number of marks necessary for measurement, the number of shots necessary to measurement, an EGA limit value, and the like; and focus-related parameters such as a focus offset that is an offset component of a signal output, placement of the focus sensor, selection of the focus sensor and a focus measurement algorithm used to process a focus signal, and the like.

(8) The selected measurement/inspection instrument sets measurement/inspection conditions according to the received data.

In the next step, step 209, measurement/inspection processing of wafer W is performed in the measurement/inspection instrument (120 or 121) that has been selected in step 208. To be more specific, a selected wafer W is carried to measurement/inspection instrument 120 and loaded on its stage.

Then, alignment of wafer W on the stage is performed using alignment system ALG. As is previously described, the matching adjustment of alignment optical systems AS and alignment sensors 21 has been performed between exposure apparatuses 100 and 101 and measurement/inspection instruments 120 and 121, using the wafer for calibration and the like, and also other measurement conditions of alignment system ALG have been adjusted so as to coincide with those of the exposure apparatus in step 208 described above, and therefore the mark detection waveforms with respect to the same mark are substantially the same, and any of the measurement/inspection instruments can detect the mark in completely the same state as in the exposure apparatus. That is, at this point in time, the difference between measurement/inspection instruments 120 and 121 has been resolved.

Figure 5A:
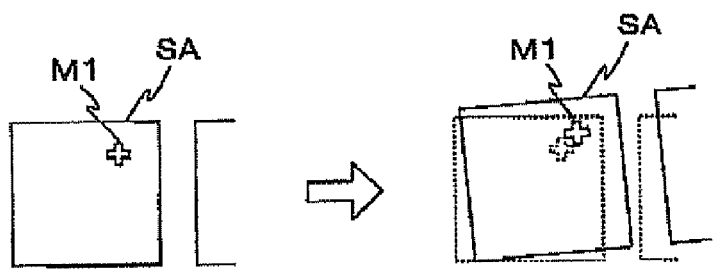
FIGS. 5A to 5C are views used to explain components of an arrangement of shot areas.
Figure 5B:
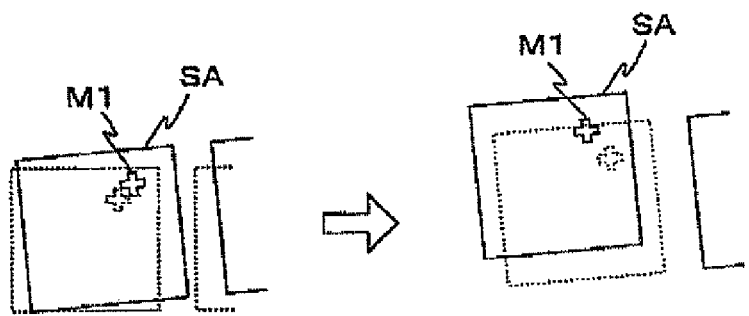
Figure 5C:
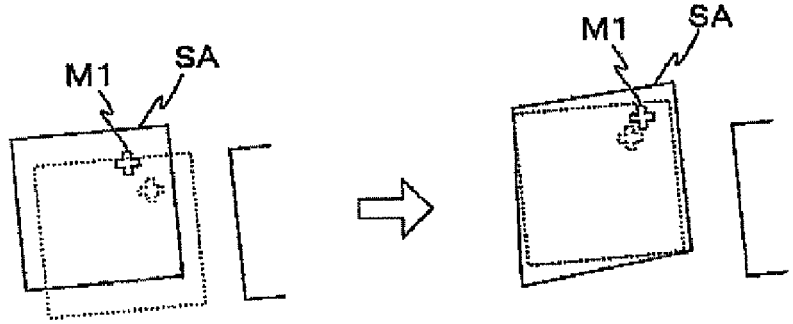

Incidentally, in this alignment, a nonlinear component of the arrangement of shot areas SA on wafer W and a nonlinear component of shot area SA itself may be detected as well. FIGS. 5A to 5C typically shows a relation among the position of mark M1 for overlay error measurement formed within shot area SA, the arrangement of shot areas SA, and shot area SA itself.

FIG. 5A is a view of the case where the arrangement of shot areas SA (wafer grid) has only a linear component. With respect to the arrangement of shot areas SA on the left side shown in FIG. 5A, the wafer grid of the arrangement of the shot areas on the right side has only rotational, magnification, and offset components, and the position of mark M1 can be obtained from only the linear components. Accordingly, in this case, mark M1 can be located at the center of the detection field of alignment system ALG when following the linear component of the arrangement of shot areas SA.

FIG. 5B is a view of the case where the arrangement of shot areas SA (water grid) has a nonlinear component besides the linear component. On the left side in FIG. 5B, the arrangement of shot areas SA having only a linear component is shown, whereas in the shot arrangement on the right side in FIG. 53, a positional relation of adjacent shot arrangement changes, and the position of mark M1 changes according to the change of the positional relation. In this case, when following the linear component and the nonlinear component of the arrangement of shot areas SA, mark M1 can be located at the center of the detection field of alignment system ALG.

As shown in FIG. 5C, in the case where shot area SA itself is deformed in addition to the linear component and the nonlinear component of the shot arrangement, the position of mark M1 is further shifted. In this case, when taking into consideration the deformation of shot area SA itself in addition to the linear component and the nonlinear component of the arrangement of shot areas SA, mark M1 for overlay error measurement can be located at the center of the detection field of alignment system ALG.

In this manner, when performing anterior measurement/inspection processing, if the position of the stage is set also taking into consideration the nonlinear component of the arrangement of shot areas SA and a deformation component of shot area SA itself, then a mark subject to measurement can be constantly located at the center of the detection field of alignment system ALG, and accordingly dispersion of mark detection error due to an aberration component that alignment system ALG has can be reduced. In order to perform such alignment, an EGA polynomial model formula in view of the nonlinear component of the arrangement of shot areas SA and the deformation component of shot area SA itself as well, needs to be employed.

Then, the selected measurement/inspection instrument (either of 120 or 121) performs measurement of shot flatness (focus level difference of shot areas) concerning shot areas SA that have been selected as measurement subject (hereinafter, referred to as measurement shots), out of a plurality of shot areas SA of the previous layer that have already been formed. The number and placement of the measurement shots can be arbitrary, and for example, can be 8 shots on the periphery of wafer W. Further, in the measurement/inspection processing, inspection of a film on wafer W, mark measurement for optimization of alignment-related parameters, and the like are also performed.

The measurement/inspection result of the measurement/inspection instrument (either of 120 or 121) is sent to exposure apparatuses 100 and 101 and analytical apparatus 170. Analytical apparatus 170 performs, for example, optimization of alignment-related parameters of exposure apparatuses 100 and 101, and the like, based on the measurement result of the mark. This optimization result is sent to the relevant exposure apparatus, and the exposure apparatus sets the optimal values of alignment-related parameters. Further, the measurement result (e.g. focus level difference) is used in focus control at the time of scanning exposure in the exposure apparatus (100 or 101).

Subsequently, the wafer is carried to the exposure apparatus (assumed to be 100), and exposure processing of transferring circuit patterns on reticle R onto wafer W is performed in exposure apparatus 100 (step 211). On this operation, exposure apparatus 100 monitors trace data of exposure dose control error, synchronous accuracy control error, focus control error and lens control error during exposure of the measurement shots, and stores the trace data in an internal memory as log data. Next, water W is carried to C/D 110 and development processing is performed in C/D 110 (step 213).

In the next step, step 214, selection of a measurement/inspection instrument that performs posterior measurement/inspection processing and setting of measurement/inspection conditions are performed. After that, the posterior measurement/inspection processing such as measurement of linewidth of the resist pattern, linewidth measurement of device patterns transferred onto wafer W, pattern defect inspection and the like is performed (step 215). These steps 214 and 215 may be performed after etching processing (to be described later).

There are various kinds as processing contents of the posterior measurement/inspection processing, and for example, the contents below can be given.

(1) Overlay error measurement of device patterns
(2) Pattern defect inspection of device patterns In the following description, the processing in steps 214 and 215 concerning each of the measurement/inspection processing in (1) and (2) will be explained in detail In step 214, because the processing up to selection of the measurement/inspection instrument is the same as described earlier, the processing after selecting the measurement/inspection instrument will be explained.

[Overlay Error Measurement of Device Pattern]

First of all, the selected measurement/inspection instrument inquires about data on processing conditions necessary for measurement/inspection to the exposure apparatus (which is either of 100 or 101, but is assumed to be exposure apparatus 100 in this case). Exposure apparatus 100 sends the measurement/inspection instrument information necessary for overlay error measurement, such as environment (temperature, humidity, and pressure) within exposure apparatus 100, measurement conditions of alignment system ALG, data of alignment result of wafer W (water grid and a deformation component of shot area SA itself), data of surface shape and the like of wafer W (focus level difference data), focus-related parameters and the like. According to the sent information, the measurement/inspection instrument matches the environment within the measurement/inspection instrument, the measurement conditions of the alignment system, and the like to those of exposure apparatus 100.

In the overlay error measurement of device patterns, alignment is performed in a state where the measurement conditions of alignment system ALG (processing conditions of alignment device 22, and the like) in exposure apparatus 100 are set.

Then, measurement of a mark for overlay error measurement on wafer W is performed. In this case, the focusing of the optical system with respect to the mark subject to measurement is performed under the same focus-related parameters as those of exposure apparatus 100, taking into consideration data on focus level difference measured in the anterior measurement/inspection processing. With this operation, the time required for focusing with respect to the mark can be reduced.

Further, since many marks for overlay error measurement are formed in shot area SA, mark(s) whose formation state is not favorable can be excluded from the measurement subject. In this case, the selected measurement/inspection instrument inquires about the mark (s) to be excluded from the measurement subject to analytical apparatus 170. After receiving this inquiry, analytical apparatus 170 requests transmission of log data to exposure apparatus 100. Exposure apparatus 100 transmits the log data obtained when having performed processing to that wafer W to analytical apparatus 170. Based on the received log data, analytical apparatus 170 computes control error at the point where the mark for overlay error measurement is formed, from the log data between "A" and "B".

Then, using the control error as a key, the CD table group is referred to, and an estimated linewidth value of the mark for overlay error measurement is obtained. Then, in the case where the estimated linewidth value is deviated from the designed linewidth by a predetermined value or more, setting is performed so that the mark for overlay error measurement is excluded from the measurement subject. Then, the analytical result of each of the marks for overlay error measurement on wafer W that are subject to measurement is returned to the measurement/inspection instrument.

Incidentally, analytical apparatus 170 can perform various types of processing other than the exclusion of the mark(s). For example, in the case where a mark for overlay error measurement is a line-and-space pattern (L/S pattern), and the asymmetry property of the mark for overlay error measurement can be estimated based on the log data of exposure apparatus 100, a positional deviation amount of the mark that is estimated from the asymmetry property may be computed as the analytical result.

The measurement/inspection instrument that receives the analytical result from analytical apparatus 170 performs measurement of overlay error using the marks for overlay error measurement that are not excluded, based on the result, and if necessary, corrects the overlay error by the positional deviation amount computed as described above.

Incidentally, analytical apparatus 170 may perform exclusion of the mark(s) for overlay error measurement, estimation of the positional deviation amount and the like, by referring to not only the log data of exposure apparatus 100 but also the log data of C/D 110, the result of measurement/inspection of a film on wafer W (film thickness, scratch on a film, film coming off, or the combination thereof) that has been performed in at least one of the processing such as the anterior measurement/inspection processing. Further, in the case where the positional deviation amount of the mark for overlay error measurement can be estimated to some extent from data on environment of the exposure apparatus, analytical apparatus 170 may compute the positional deviation amount and send it to the measurement/inspection instrument. In this case, in the estimation of the positional deviation amount, for example, the following formula can be used.

[Formula 1]

$$\text{Result} = \text{Result} + \alpha \times \Delta\text{Temperature} + \text{offset}T + \beta \times \Delta\text{Humid} + \text{offset}H + + \gamma \times \text{Press} + \text{offset}P \quad (1)$$

In this case, "Result" denotes a positional deviation amount of a mark to be computed. "Result" is computed by an incremental value from a value of the preceding sample (one sample before). The incremental value is the linear function of temperature change $\Delta$Temperature, humidity change $\Delta$Humid, and pressure change $\Delta$Press. Each of $\alpha$, $\beta$, and $\gamma$ is a coefficient, and offsetT, offsetH, and offsetP are offset components with respect to the temperature change, the humidity change, and the pressure change, respectively. Incidentally, "Result" on the right-hand side in the formula (1) denotes a value of the preceding sample, and "Result" on the left-hand side denotes an updated value. The formula (1) shows that an updated "Result" on the left-hand side is obtained as a result of adding data on environment of the exposure apparatus to "Result" of the preceding sample.

Incidentally, coefficients $\alpha$, $\beta$, and $\gamma$, and offsets offsetT, offsetH, and offsetP can be obtained based on statistical data that shows a relation between the temperature change, the humidity change and the pressure change, and the positional deviation amount of the mark, which were previously acquired, for example, using a method such as statistical analysis. For example, the relation during one month or one day is measured and by using the measurement data, the above-described coefficients and the offsets can be computed using the least-squares method or the like.

[Defect Inspection of Device Pattern]

First of all, the selected measurement/inspection instrument inquires about data on processing conditions and the like necessary for measurement/inspection to the exposure apparatus (assumed to be 100). The exposure apparatus sends the measurement/inspection instrument information necessary for detect inspection of device patterns, such as environment (temperature, and humidity) within the exposure apparatus, measurement conditions of alignment system ALG, data on the alignment result of wafer W (wafer grid and a deformation component of shot area SA itself), and data on surface shape and the like of wafer W. According to the sent information, the measurement/inspection instrument matches environment within the measurement/inspection instrument, measurement conditions of the alignment system, focus-related parameters (including focus level difference data) and the like to those of exposure apparatus 100.

Also in the defect inspection of device patterns, wafer alignment is performed in a state where the measurement conditions of alignment system ALG (such as processing conditions of alignment device 22) in exposure apparatus 100 are set.

Then, measurement of the mark for overlay error measurement on wafer W is performed. In this case, focusing of the measurement optical system with respect to the mark subject to measurement is performed in view of the focus level difference data measured in the anterior measurement/inspection processing. This can shorten the time required for focusing with respect to the mark.

The selected measurement/inspection instrument inquires about measurement processing contents to analytical apparatus 170. Then, after receiving this inquiry, analytical apparatus 170 requests transmission of log data to exposure apparatus 100. The exposure apparatus transmits log data obtained when having performed processing to the wafer W to analytical apparatus 170. Based on the received log data, analytical apparatus 170 computes control error at the point where the pattern subject to inspection is formed using the log data between "A" and "B", as shown in FIGS. 3A to 3E. Then, an estimated linewidth value of the pattern is obtained referring to the CD table group with the control error as a key. Then, setting is performed so that pattern inspection is finely performed to the pattern whose estimated linewidth value is deviated from the designed linewidth by a predetermined value or more. Then, the analytical result of each of the marks for overlay error measurement on wafer W subject to measurement is returned to the measurement/inspection instrument.

Incidentally, the measurement/inspection instrument performs pattern defect inspection according to the analytical results. In this case, regarding a place where control error is large and there is the high possibility that pattern defect occurs, the detection sensitivity of defect inspection may be set higher. Further, regarding a place where the control error is small and the estimated linewidth value and the designed linewidth are substantially coincident, the reliability of the pattern is considered to be high, and therefore the detection sensitivity of pattern defect inspection can be set lower, or the relatively rough pattern inspection can be performed.

Incidentally, analytical apparatus 170 may perform the sensitivity setting of pattern defect inspection, referring to not only the log data of the exposure apparatus, but also the log data of C/D 110, and the result of measurement/inspection of a film (film thickness, scratch on a film, film coming off, or the combination thereof) of wafer W that has been performed at least one of the processing such as the anterior measurement/inspection processing.

After the processing of steps 214 and 215 has been performed as is described above, wafer W is carried from the measurement/inspection instrument to etching apparatus 930, and etching is performed in etching apparatus 930, and impurity diffusion processing, wiring processing, film formation in film forming apparatus 910, planarization in CMP apparatus 940, ion implantation processing in oxidation/ion-implantation apparatus 920, and the like are performed when necessary (step 219). Then, host 600 judges whether or not all the processes have been completed and all the patterns have been formed on the wafer (step 221). When this judgment is denied, the procedure returns to step 205, and when the judgment is affirmed, the procedure proceeds to step 223. In this manner, by repeatedly executing a series of processes from film forming/resist coating to etching, and the like according to the number of processes (layers), circuit patterns are layered on wafer W and a semiconductor device is formed.

After the repeated process has been completed, probing processing (step 223) and repair processing (step 225) are executed in device manufacturing/processing apparatus group 900. When memory defect is detected in step 223, for example, processing for substituting a redundant circuit is performed in step 225. Analytical apparatus 170 can also send information of the place where pattern defect has occurred and the like to an apparatus that performs the probing processing and the repair processing. In an inspection device (not shown), the place where linewidth abnormality occurs on wafer W can be excluded chip by chip from the processing subject of the probing processing and repair processing. Afterward, dicing processing (step 227), packaging processing and bonding processing (step 229) are executed, and a product chip is finally completed. Incidentally, the posterior measurement/inspection processing in step 215 may be performed after the etching in step 219. In this case, measurement of overlay error and/or pattern defect inspection will be performed to images formed on wafer W after the etching (hereinafter, also referred to as an etching image). Such measurement and/or inspection may be performed after the development and also after the etching. In this case, since the measurement/inspection is performed to both the resist image and the etching image, the processing state of the etching processing can be detected based on the difference between these measurement results.

Figure 6:
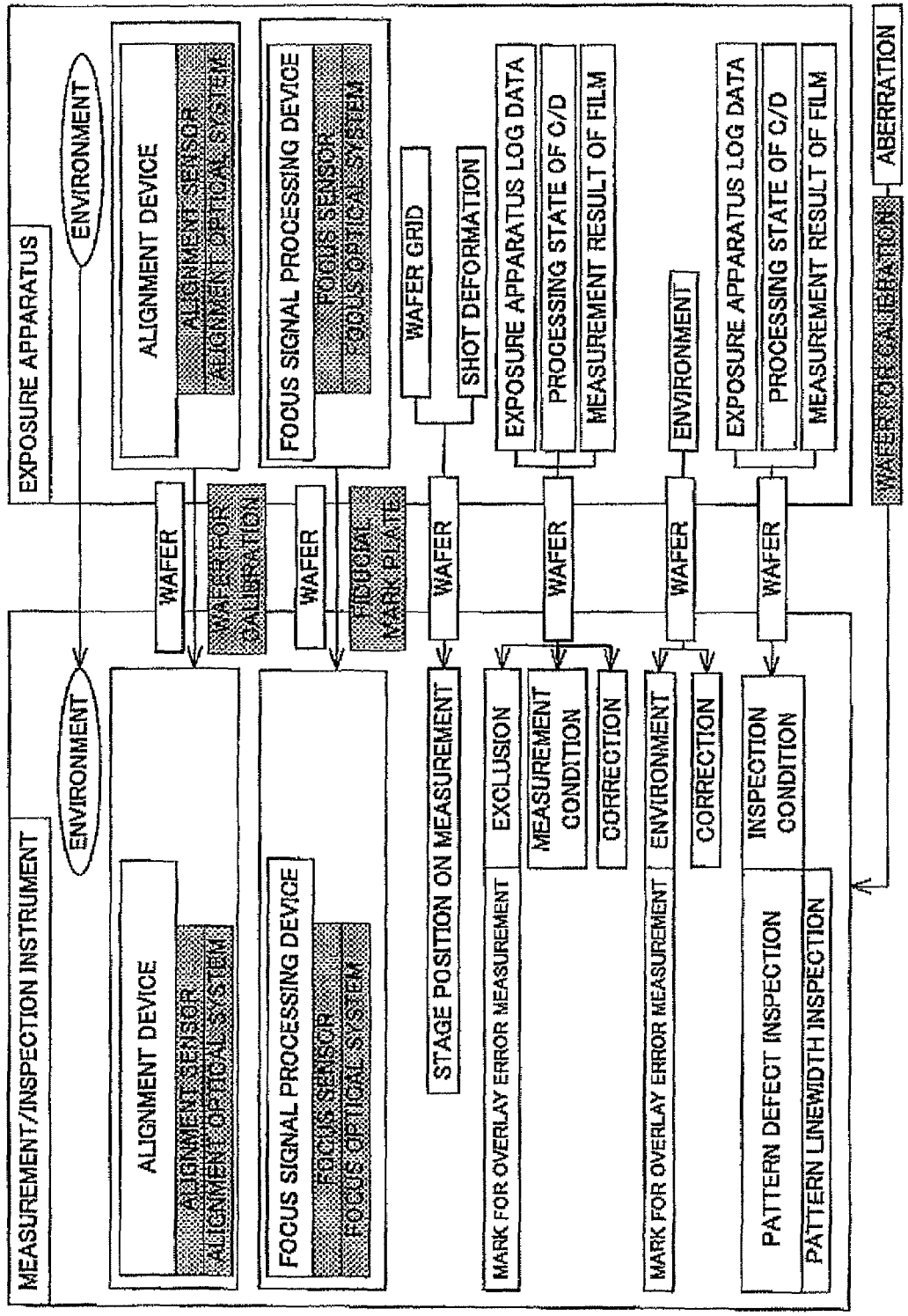
FIG. 6 is a view typically showing conditions that can be matched between the exposure apparatus and a measurement/inspection instrument.
Figure 7A:
FIGS. 7A to 7E are views showing examples of marks for overlay error measurement.
Figure 7B:
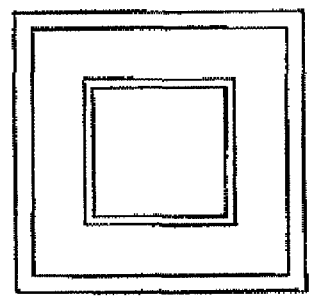
Figure 7C:
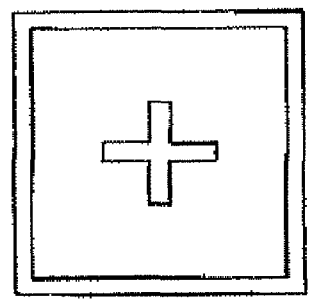
Figure 7D:
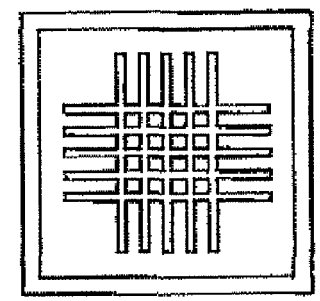
Figure 7E:
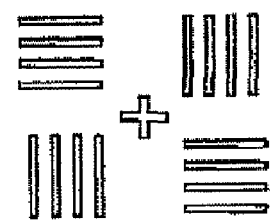

FIG. 6 typically enumerates processing conditions in the measurement/inspection instrument that can be matched to those in the exposure apparatus.

As shown in FIG. 6, first, environmental data such as the temperature, humidity, pressure and the like on exposure can be matched between the exposure apparatus and the measurement/inspection instrument. The measurement/inspection instrument acquires the environmental data at the time when exposure has been performed in the exposure apparatus from the exposure apparatus directly, or via analytical apparatus 170, management controller 160, or host 600, and performs environment control within the instrument so that the environment within the instrument and the environment shown by the data become the same, and then performs measurement/inspection to wafer W in a state where the environment has become the same.

Moreover, adjustment of the alignment systems is performed between the exposure apparatus and the measurement/inspection instrument.

Matching adjustment of a part of processing conditions of hardware such as the alignment optical systems used to detect the marks, and the alignment sensors used to detect the mark waveform signals is performed by the calibration processing using the wafer for calibration. Then, prior to the anterior measurement/inspection processing and the posterior measurement/inspection processing to wafer W, condition setting is performed of conditions which need to be different for each wafer W, for example, parameters of the wavelength and focus offset at the time of mark measurement by the alignment optical systems, and processing conditions of the signal processing device that processes mark waveform data detected by the alignment sensors, such as a mark length, a mark type, a mark pitch, a mark width, a mark center shift, a signal waveform shape (single/double), a mark detection algorithm, a mark detection permissible value, the number of marks necessary for measurement, the number of shots necessary for measurement, an EGA limit value and the like, so that such parameters are matched between the exposure apparatus and the measurement/inspection instrument.

Furthermore, matching adjustment of apart of processing conditions of hardware such as the focus optical systems and the focus sensors used to detect focus signals used in alignment or device pattern processing is performed by the calibration processing using fiducial mark plate FM (or the wafer for calibration). Then, prior to the measurement/inspection processing to wafer W, condition setting is performed of conditions which need to be different for each wafer W, such as parameters of a part of processing conditions of the focus optical systems and the focus sensors, processing conditions of the signal processing device that processes the focus signals detected by the focus optical systems and the focus sensors, a device level difference correction map, the focus offset, the focus sensor placement, the focus sensor selection, and the focus detection algorithm and the like, so that such parameters are matched between the exposure apparatus and the measurement/inspection instrument.

Further, when performing measurement of a mark on wafer W, the mark needs to be moved to a detection filed of an alignment system. However, an actual position of the mark on wafer W is deviated from a designed position, in accordance with the arrangement (wafer grid) of shot area SA including the mark and/or distortion of a device pattern of shot area SA itself (distortion of an image of a device pattern occurring on transfer). The arrangement of the shot area and the distortion of the device pattern include nonlinear components that can only be expressed by a high-order function, besides linear components such as a rotation, a magnification, an offset and the like. In the alignment system the mark subject to measurement can constantly be located in the center of the detection field of the alignment, if such nonlinear components are also taken into consideration.

Further, in the case of performing measurement of overlay error of device patterns on wafer W in the posterior measurement/inspection processing, whether each mark for overlay error measurement is appropriate or not is judged in view of the log data of various types of control errors of exposure apparatuses 100 and 101, the processing state of C/D 110, and the measurement result of a resist film. For example, based on the log data, a mark that is inappropriate for overlay error measurement is excluded, measurement conditions of the mark are adjusted, or the measurement position of the mark for overlay error measurement is corrected. This makes it possible to stabilize the measurement/inspection result to reduce the difference among the measurement/inspection instruments.

Moreover, on overlay error measurement, it is also possible to match the environment of the measurement/inspection instrument to the environment of the exposure apparatus, or correct the measurement position of the mark for overlay error measurement.

Further, in the case of performing linewidth measurement of the device pattern on wafer W and/or inspection of pattern defect in the posterior measurement/inspection processing, log data of various types of control errors of exposure apparatuses 100 and 101, the processing state of C/D 110, and the measurement result of a resist film are taken into consideration. For example, based on the log data, an area in which pattern linewidth abnormality and/or pattern defect occur (s) is inspected in detail, or inspection conditions such as inspection sensitivity, an inspection resolution, or an inspection algorithm are adjusted for such an area.

Furthermore, although a measurement/inspection pattern formed on a wafer for calibration has bean formed by transfer under the strict criteria, the measurement/inspection pattern has been affected by aberration in the projection optical system of the exposure apparatus because the measurement/inspection pattern has been transferred by the exposure apparatus similarly to the case of a pattern on a process wafer. Therefore, matching adjustment of the alignment system based on the measurement/inspection result of the measurement/inspection pattern of the wafer for calibration may be performed, in view of deformation of the measurement/inspection pattern due to the aberration.

In the points described above, in the case of coinciding the processing conditions between the exposure apparatus and the measurement/inspection instrument, the processing states of the exposure apparatus and the measurement/inspection instrument are substantially the same, which allows the difference of the measurement/inspection result between the measurement/inspection instruments with respect to the wafer w to reduce, and thus stable measurement/inspection can constantly be performed.

As is described in detail so far, according to the embodiment, based on information on wafer w and/or information on a series of substrate processing to the water W, a measurement/inspection instrument that is suitable for measurement/inspection of wafer W is selected from among a plurality of measurement/inspection instruments 120 and 121 that perform the sane measurement/inspection processing, and also in accordance with actual wafer W and/or the substrate processing, the measurement/inspection conditions of measurement/inspection instruments 120 and 121 are adjusted, or their measurement/inspection results are corrected. With this operation, measurement/inspection in a state appropriate for the wafer W can be performed, and therefore the differences between measurement/inspection instrument 120 and measurement/inspection instrument 121 can be reduced on measurement/inspection of actual process wafer W.

Moreover, according to the embodiment, prior to practical operation, a calibration process can be performed in which a wafer for calibration is sequentially loaded to each of exposure apparatuses 100 and 101 and measurement/inspection instruments 120 and 121, and the same measurement/inspection mark on the water for calibration is measured/inspected by respective alignment systems ALG, and operational conditions of the detection systems of alignment systems ALS are calibrated so that the measurement/inspection results are matched between exposure apparatuses 100 and 101, and measurement/inspection instruments 120 and 121. With this process, matching adjustment of hardware of alignment systems ALG is performed so that the measurement/inspection results of the same mark become the same between measurement/inspection instruments 120 and 121, and between the exposure apparatuses and the measurement/inspection instruments, and the like.

Incidentally, in the embodiment, exposure apparatuses 100 and 101 and measurement/inspection instruments 120 and 121 are to be equipped with the alignment systems (including the autofocus mechanisms) having the same configuration, but the alignment systems of the respective apparatuses/instruments do not necessarily have the same hardware configuration. For example, in the embodiment, exposure apparatuses 100 and 101 and measurement/inspection instruments 120 and 121 are to be each equipped with alignment optical system AS and alignment sensor 21 that photoelectrically detect waveform data corresponding to alignment marks on wafer W, and the focus optical system (60a, 60b) and focus sensor 23 that detect a focus state of the alignment marks, but the present invention is not limited thereto, and alignment optical system AS and alignment sensor 21, or the focus optical system (60a, 60b) and focus sensor 23 only have to be common. In this case as well, the operational conditions of the common hardware can be calibrated using the wafer for calibration.

That is, all of the detection systems do not have to be common among the respective apparatuses/instruments, and if the detection systems partially have the common section, then the processing conditions regarding the common section can be adjusted. Further, even when there is no common section among the detection systems, adjustment can also be performed so as to make the measurement/inspection results coincide with one another as much as possible.

Incidentally, as data on a series of substrate processing which is used to adjust the measurement conditions and the like of the measurement/inspection instruments, various data can be applied. For example, data on the detection processing of alignment marks formed on wafer w by the substrate processing, data on the focus state of the marks of alignment systems ALG of exposure apparatuses 100 and 101, data on the arrangement of shot areas AS formed on wafer W by exposure, data on distortion of a device pattern (deformation of shot area SA) formed on wafer W by exposure, data on the processing state of exposure apparatuses 100 and 101, data on the environment in exposure apparatuses 100 and 101, data on the measurement/inspection result of a film formed on wafer W, and the like can be applied.

By using these kinds of data, measurement/inspection conditions of various measurement/inspection contents and/or the measurement/inspection result can be adjusted. For example, regarding the measurement processing of a plurality of marks for overlay error measurement included in device patterns overlaid and formed on wafer W, adjustment of at least one of the measurement condition, the measurement result, and the measurement environment of the marks for overlay error measurement can be performed, based on at least one of information on the processing state of exposure apparatuses 100 and 101, data on the environment of exposure apparatuses 100 and 101, and data on the measurement/inspection result of a film formed on wafer W.

Moreover, based on at least one of information on the processing state of exposure apparatuses 100 and 101, information on the environment within exposure apparatuses 100 and 101, and information on the measurement/inspection result of a film formed on wafer W, the mark for overlay error measurement which has been judged as abnormal may be excluded.

Further, in the pattern detect inspection of a device pattern formed on wafer W, based on at least one of information on the processing state of exposure apparatuses 100 and 101, and information on the measurement/inspection result of a film formed on wafer W, the inspection conditions of the pattern defect inspection can be adjusted. To be more specific, a portion that is judged as abnormal is inspected more intensively, compared with a portion that is diagnosed as normal. Furthermore, by decreasing the inspection frequency of pattern defect of the portion that is diagnosed as normal, reduction in the entire throughput can be prevented.

Further, in the embodiment, an actual process wafer is used in the adjustment of the measurement/inspection instruments, but the wafer for calibration, which was used in the matching adjustment of hardware of measurement/inspection instruments 120 and 121 and exposure apparatuses 100 and 101, may also be used. In this case, at least one of the measurement/inspection conditions of a measurement/inspection instrument that has been selected as a measurement/inspection instrument that performs the measurement/inspection processing, and information on the measurement/inspection result of such a measurement/inspection instrument can be adjusted, in view of data on distortion of a measurement/inspection pattern formed on the wafer for calibration (e.g. aberration data of a projection optical system of an exposure apparatus that has transferred the pattern).

Further, in the embodiment, as data used to perform selection and adjustment of measurement/inspection instruments 120 and 121, for example, data on control error in the film forming processing and/or the development processing in C/D 110 can also be used, besides data on the processing state of exposure apparatuses 100 and 101, that is, data on control error between wafer W and a device pattern in exposure. Incidentally, not being limited thereto, data on the processing state of the respective apparatuses in device manufacturing/processing apparatus group 900 can also be used in the adjustment of a measurement/inspection instrument that performs measurement/inspection of wafer W after that processing of the respective apparatuses.

Incidentally, in general, a plurality of different marks for overlay error measurement are formed on reticle R in many cases. For examples, marks as shown in FIGS. 7A to 7E are to be formed on reticle R as the marks for overlay error measurement, and to be formed by transfer together with a device pattern on wafer W.

As the mark for overlay error measurement, either one of the marks may be selected. In the embodiment, out of the marks exemplified in FIGS. 7A to 7E, a mark with which the difference of measurement/inspection result among the measurement/inspection instruments is minimized can also be selected. Also in such a case, the measurement/inspection state is stabilized, and the difference among the measurement/inspection instruments is reduced.

Incidentally, in the embodiment above, analytical apparatus 170 acquires the log data from exposure apparatus 100 without change, but if the statistical value (MSD value, MEAN value) of control error has been computed in exposure apparatus 100, the statistical value may be acquired.

Further, in the embodiment above, adjustment of the measurement/inspection conditions of the measurement/inspection instrument and the like is performed with respect to every wafer, but the present invention is not limited thereto. For example, the adjustment may be performed every time when abnormality of the measurement/inspection result is detected, or may be performed at predetermined intervals (such as every few wafers, or with respect to predetermined time lapse).

In the embodiment above, measurement/inspection instruments 120 and 121 are to be inline connected to exposure apparatus 100 and the like, but measurement/inspection instruments 120 and 121 may be offline measurement/inspection instruments which are not inline connected to exposure apparatus 100 and track 200.

Moreover, as is disclosed in Kokai (Japanese Unexamined Patent Application Publications) No. 11-135400 and No. 2000-614504, the pamphlet of International Publication No. 2005/074014, the pamphlet of International Publication No. 1999/023692, the U.S. Pat. No. 6,897,963 and the like, the present invention can also be applied to an exposure apparatus that is equipped with a wafer stage that holds wafer W and a measurement stage that mounts a reference member on which a reference mark is formed and various types of photoelectric sensors.

Incidentally, in the embodiment above, the exposure apparatus by a step-and-scan method has been explained, but the present invention can also be applied to an exposure apparatus by a step-and-repeat method as a matter of course, and also to other exposure apparatuses such as an exposure apparatus by a proximity method. Further, the present invention can suitably be applied also to an exposure apparatus by a step-and-stitch method that synthesizes a shot area and a shot area. As is represented by these examples, the types of the various apparatuses are not limited to the forgoing types either. For example, as is disclosed in, U.S. Pat. No. 6,778,257, an exposure apparatus may be used, for example, that employs, instead of reticle R, an electron mask (which is also called a variable shaped mask, an active mask or an image generator, and includes, for example, a DMD (Digital Micro-mirror Device) that is a type of a non-emission type image display device (spatial light modulator) or the like) on which a light-transmitting pattern, a reflection pattern, or an emission pattern is formed according to electronic data of the pattern to be exposed.

Moreover, the present invention can also be applied to a multi-stage type exposure apparatus equipped with a plurality of wafer stages, as is disclosed in, for example, the pamphlet of International Publication No. 98/24115, the pamphlet of International Publication No. 98/40791, Kokai (Japanese Unexamined Patent Application Publications) No. 10-163099 and No. 10-214783 (the corresponding U.S. Pat. No. 6,590,634), Kohyo (published Japanese translation of international Publication for Patent Application) No. 2000-505958 (the corresponding U.S. Pat. No. 5,969,441), the U.S. Pat. No. 6,208,407, and the like. Furthermore, it goes without saying that the present invention can also be applied to an exposure apparatus using a liquid immersion method, which is disclosed in, for examples the pamphlet of International Publication No. 99/49504, the pamphlet of International Publication No. 2004/053955 (the corresponding U.S. Patent Application Publication No. 2005/0259234), U.S. Pat. No. 6,952,253, EP Patent Application Publication No 1 420 298, the pamphlet of International Publication No. 2004/055803, the pamphlet of International Publication No. 2004/057590, the U.S. Patent Application Publication No. 2006/0231206, U.S. Patent Application Publication No. 2005/0280791, and the like. In this case, an exposure apparatus in which the space between a projection optical system and a substrate is locally filled with liquid is employed, but the present invention can also be applied to a liquid immersion exposure apparatus that performs exposure in a state where a surface to be exposed of a substrate that is subject to exposure is entirely immersed in liquid, as is disclosed in, Kokai (Japanese Unexamined Patent Application Publications) No. 06-124873 and No. 10-303114, the U.S. Pat. No. 5,825,403, and the like. For example, it is also possible that exposure apparatus 100 is a liquid immersion exposure apparatus and exposure apparatus 101 is an exposure apparatus that is not a liquid immersion type.

Incidentally, the above disclosures of all the publications, the pamphlets of the International Publications, and the U.S. patent application Publications and the U.S. patent descriptions that are cited in the embodiment above and related to exposure apparatuses and the like are each incorporated herein by reference.

Further, the present invention can be applied to not only the semiconductor manufacturing process but also a manufacturing process of displays including liquid crystal display devices and the like. Further, it goes without saying that the present invention can be applied to linewidth management in all the device manufacturing processes, besides a process of transferring a device pattern onto a glass plate, a manufacturing process of thin film magnetic heads, and a manufacturing process of imaging devices (such as CCDs), micro machines, organic ELs, DNA chips and the like.

Further, in the embodiment above, analytical apparatus 170 is to be, for example, a PC. That is, the analytical processing in analytical apparatus 170 is realized by the analytical program being executed by the PC. This analytical program may be capable of being installed in the PC via a medium, or of being downloaded in the PC via internet, as is described previously. Further, analytical apparatus 170 can be configured of hardware as a matter of course. Analytical apparatus 170 that is independent is arranged in the embodiment above, but analytical apparatus 170 may be equipped in each of measurement/inspection instruments 120 and 121. In this case, the analytical function equipped in measurement/inspection instruments 120 and 121 judges whether or not measurement/inspection instrument 120 or 121 itself is appropriate for measuring/inspecting wafer W, based on data on wafer W and/or data of the processing state of exposure apparatuses 100 and 101.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A device manufacturing method of manufacturing a device through a series of substrate processing that includes measurement/inspection processing to a substrate, the method comprising:
    an acquisition process of acquiring at least one of information on the substrate and information on the series of substrate processing to the substrate;
    a selection process of selecting one measurement/inspection instrument that actually measures/inspects the substrate from among a plurality of measurement/inspection instruments that perform the same measurement/inspection processing, based on the information that has been acquired; and
    an adjustment process of adjusting at least one of a measurement/inspection condition and information on a measurement/inspection result of the measurement/inspection instrument that has been selected, based on the information that has been acquired.

2. The device manufacturing method according to claim 1, wherein
    in the case where a detection system that is arranged in the measurement/inspection instrument and detects information on the substrate and a detection system that is arranged in a substrate processing apparatus that performs the substrate processing and detects information on the substrate are common at least partially,
    the device manufacturing method further comprises
    a calibration process of calibrating an operational condition of a common section of the detection systems of the measurement/inspection instrument and the substrate processing apparatus, using a reference substrate for calibration, prior to the adjustment process.

3. The device manufacturing method according to claim 2, wherein
    the detection system comprises at least one of
    a pattern detecting system that photoelectrically detects information on a pattern on the substrate, and
    a focus detecting system that detects information on focus of the substrate with respect to the detection system.

4. The device manufacturing method according to claim 1, wherein
    information on the series of substrate processing to the substrate includes at least one of
    information on detection processing of an alignment mark formed on the substrate by the substrate processing,
    information on focus of the substrate processing apparatus,
    information on an arrangement of a pattern formed on the substrate by the substrate processing,
    information on distortion of a pattern formed on the substrate by the substrate processing,
    information on a processing state of the substrate processing,
    information on environment of the substrate processing, and
    information on a measurement/inspection result of a film formed on the substrate.

5. The device manufacturing method according to claim 4, wherein
    the measurement/inspection processing includes measurement of a plurality of marks for overlay error measurement included in device patterns that have been overlaid and formed on the substrate, and
    in the adjustment process, adjustment of at least one of a measurement condition, a measurement result and measurement environment of the marks for overlay error measurement is performed, based on at least one of information on a processing state of the substrate processing, information on environment of the substrate processing, and information on a measurement/inspection result of a film formed on the substrate.

6. The device manufacturing method according to claim 4, wherein
    the measurement/inspection processing includes measurement of a plurality of marks for overlay error measurement included in device patterns that have been overlaid and formed on the substrate, and
    in the adjustment process, a mark for overlay error measurement that has been judged as abnormal is excluded, based on at least one of information on a processing state of the substrate processing, information on environment of the substrate processing, and information on a measurement/inspection result of a film formed on the substrate.

7. The device manufacturing method according to claim 4, wherein
the measurement/inspection processing includes at least one of pattern linewidth inspection and pattern defect inspection of a device pattern formed on the substrate, and
in the adjustment process, an inspection condition of at least one of the pattern linewidth inspection and the pattern defect inspection is adjusted, based on at least one of information on a processing state of the substrate processing and information on a measurement/inspection result of a film formed on the substrate.

8. The device manufacturing method according to claim 7, wherein
in the adjustment process, a portion that has been judged as abnormal is inspected more intensively, compared with a portion that has been diagnosed as normal.

9. The device manufacturing method according to claim 8, wherein
in the adjustment process, inspection frequency of pattern linewidth or inspection frequency of pattern defect of a portion that has been diagnosed as normal is decreased.

10. The device manufacturing method according to claim 9, wherein
in the case where as the substrate, a reference substrate for calibration is used,
in the adjustment process, at least one of a measurement/inspection condition and information on a measurement/inspection result of a measurement/inspection instrument that has been selected as a measurement/inspection instrument that performs the measurement/inspection processing is adjusted, in view of information on distortion of a measurement pattern formed on the reference substrate.

11. The device manufacturing method according to claim 4, wherein
the substrate processing includes film forming processing onto the substrate, transfer processing of a device pattern to the substrate, development processing of the device pattern that has been transferred, and etching processing of the device pattern that has been transferred, and
the information on a processing state of the substrate processing includes at least one of information on a control error of the substrate and the device pattern in the transfer processing and information on a processing state in the film forming processing and the development processing.

12. A device manufacturing system that manufactures a device through a series of substrate processing that includes measurement/inspection processing to a substrate, the system comprising:
an acquisition device that acquires at least one of information on the substrate and information on the series of substrate processing to the substrate;
a plurality of measurement/inspection instruments that perform the same measurement/inspection processing;
a selection device that selects one measurement/inspection instrument that actually measures/inspects the substrate from among the plurality of measurement/inspection instruments, based on the information that has been acquired; and
an adjustment device that adjusts at least one of a measurement/inspection condition and information on a measurement/inspection result of the measurement/inspection instrument that has been selected, based on the information that has been acquired.

13. The device manufacturing system according to claim 12, further comprising:
a substrate processing device that performs the substrate processing; wherein
in the case where a detection system that is arranged in the measurement/inspection instrument and detects information on the substrate and a detection system that is arranged in the substrate processing apparatus and detects information on the substrate are common at least partially,
the device manufacturing system further comprises
a calibration device that calibrates an operational condition of a common section of the detection systems of the measurement/inspection instrument and the substrate processing apparatus, using a reference substrate for calibration, prior to adjustment by the adjustment device.

14. The device manufacturing system according to claim 13, wherein
the detection system comprises at least one of
a pattern detecting system that photoelectrically detects information on a pattern on the substrate, and
a focus detecting system that detects information on focus of the substrate with respect to the detection system.

15. The device manufacturing system according to claim 12, wherein
information on the series of substrate processing to the substrate includes at least one of
information on detection processing of an alignment mark formed on the substrate by the substrate processing,
information on focus of the substrate processing apparatus,
information on an arrangement of a pattern formed on the substrate by the substrate processing,
information on distortion of a pattern foamed on the substrate by the substrate processing,
information on a processing state of the substrate processing,
information on environment of the substrate processing, and
information on a measurement/inspection result of a film formed on the substrate.

16. The device manufacturing system according to claim 15, wherein
the plurality of measurement/inspection instruments perform measurement of a plurality of marks for overlay error measurement included in device patterns that have been overlaid and formed on the substrate, and
the adjustment device performs adjustment of at least one of a measurement condition, a measurement result and measurement environment of the marks for overlay error measurement, based on at least one of information on a processing state of the substrate processing, information on environment of the substrate processing, and information on a measurement/inspection result of a film formed on the substrate.

17. The device manufacturing system according to claim 15, wherein
the plurality of measurement/inspection instruments perform measurement of a plurality of marks for overlay error measurement included in device patterns that have been overlaid and formed on the substrate, and
the adjustment device excludes a mark for overlay error measurement that has been judged as abnormal, based on at least one of information on a processing state of the substrate processing, information on environment of the substrate processing, and information on a measurement/inspection result of a film formed on the substrate.

18. The device manufacturing system according to claim 15, wherein
the plurality of measurement/inspection instruments perform at least one of pattern linewidth inspection and pattern defect inspection of a device pattern formed on the substrate, and
the adjustment device adjusts an inspection condition of at least one of the pattern linewidth inspection and the pattern defect inspection, based on at least one of information on a processing state of the substrate processing and information on a measurement/inspection result of a film formed on the substrate.

19. The device manufacturing system according to claim 18, wherein
the adjustment device more intensively inspects a portion that has been judged as abnormal, compared with a portion that has been diagnosed as normal.

20. The device manufacturing system according to claim 19, wherein
the adjustment device decreases inspection frequency of pattern linewidth or inspection frequency of pattern defect of a portion that has been diagnosed as normal.

21. The device manufacturing system according to claim 20, wherein
in the case where as the substrate, a reference substrate for calibration is used,
the adjustment device adjusts at least one of a measurement/inspection condition and information on a measurement/inspection result of a measurement/inspection instrument that has been selected as a measurement/inspection instrument that performs the measurement/inspection processing, in view of information on distortion of a measurement pattern formed on the reference substrate.

22. The device manufacturing system according to claim 15, wherein
the substrate processing includes film forming processing onto the substrate, transfer processing of a device pattern to the substrate, development processing of the device pattern that has been transferred, and etching processing of the device pattern that has been transferred, and
the information on a processing state of the substrate processing includes at least one of information on a control error of the substrate and the device pattern in the transfer processing and information on a processing state in the film forming processing and the development processing.

23. A measurement/inspection apparatus that performs measurement/inspection processing to a substrate, the apparatus comprising:
an acquisition device that acquires at least one of information on the substrate and information on a series of substrate processing to the substrate;
a determination device that determines whether or not the measurement/inspection apparatus is appropriate for actually measuring/inspecting the substrate, based on the information that has been acquired; and
an adjustment device that adjusts at least one of a measurement/inspection condition and information on a measurement/inspection result based on the information that has been acquired, in the case where the measurement/inspection apparatus has been determined as appropriate by the determination device.

24. The measurement/inspection apparatus according to claim 23, wherein
in the case where a detection system that is arranged in the measurement/inspection apparatus and detects information on the substrate and a detection system that is arranged in a substrate processing apparatus that performs the substrate processing and detects information on the substrate are common at least partially,
the measurement/inspection apparatus further comprises
a calibration device that calibrates an operational condition of a common section of the detection systems, using a reference substrate for calibration, prior to adjustment by the adjustment device.

* * * * *